(12) United States Patent
Seshadri et al.

(10) Patent No.: US 8,971,138 B2
(45) Date of Patent: Mar. 3, 2015

(54) METHOD OF SCREENING STATIC RANDOM ACCESS MEMORY CELLS FOR POSITIVE BIAS TEMPERATURE INSTABILITY

(75) Inventors: Anand Seshadri, Richardson, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 284 days.

(21) Appl. No.: 13/467,517

(22) Filed: May 9, 2012

(65) Prior Publication Data

US 2013/0058177 A1 Mar. 7, 2013

Related U.S. Application Data

(60) Provisional application No. 61/530,131, filed on Sep. 1, 2011.

(51) Int. Cl.
*G11C 29/00* (2006.01)
*G11C 29/50* (2006.01)
*G11C 29/04* (2006.01)
(Continued)

(52) U.S. Cl.
CPC .......... *G11C 29/50* (2013.01); *G11C 29/50016* (2013.01); *G11C 29/50004* (2013.01); *G11C 29/06* (2013.01); *G11C 11/41* (2013.01); *G11C 2029/5002* (2013.01)
USPC ........... 365/201; 365/154; 365/156; 365/200; 714/718; 714/719; 714/721

(58) Field of Classification Search
CPC .. G11C 29/00; G11C 29/50; G11C 29/50004; G11C 29/50016; G11C 2029/5002
USPC .......... 365/154, 156, 200, 201; 714/718, 719, 714/721
See application file for complete search history.

(56) References Cited

U.S. PATENT DOCUMENTS

| | | | | |
|---|---|---|---|---|
| 6,650,580 | B1 * | 11/2003 | Braceras | 365/201 |
| 6,887,800 | B1 * | 5/2005 | Metz et al. | 438/778 |
| 7,382,674 | B2 * | 6/2008 | Hirabayashi | 365/226 |

(Continued)

OTHER PUBLICATIONS

U.S. Appl. No. 13/189,675, filed Jul. 25, 2011, entitled "Method of Screening Static Random Access Memories for Unstable Memory Cells".

(Continued)

*Primary Examiner* — J. H. Hur
(74) *Attorney, Agent, or Firm* — Rose Alyssa Keagy; Frederick J. Telecky, Jr.

(57) ABSTRACT

A method of screening complementary metal-oxide-semiconductor CMOS integrated circuits, such as integrated circuits including CMOS static random access memory (SRAM) cells, for n-channel transistors susceptible to transistor characteristic shifts over operating time. For the example of SRAM cells formed of cross-coupled CMOS inverters, static noise margin and writeability ($V_{trip}$) screens are provided. Each of the n-channel transistors in the CMOS SRAM cells are formed within p-wells that are isolated from p-type semiconductor material in peripheral circuitry of the memory and other functions in the integrated circuit. Forward and reverse body node bias voltages are applied to the isolated p-wells of the SRAM cells under test to determine whether such operations as read disturb, or write cycles, disrupt the cells under such bias. Cells that are vulnerable to threshold voltage shift over time can thus be identified.

27 Claims, 11 Drawing Sheets

(51) Int. Cl.
*G11C 29/06* (2006.01)
*G11C 11/41* (2006.01)

(56) References Cited

U.S. PATENT DOCUMENTS

| | | | |
|---|---|---|---|
| 7,508,697 B1* | 3/2009 | Mukhopadhyay et al. | ... 365/154 |
| 2004/0252548 A1* | 12/2004 | Tsukamoto et al. | ........... 365/154 |
| 2007/0133326 A1* | 6/2007 | Ishikura et al. | ............... 365/201 |
| 2008/0144365 A1* | 6/2008 | Yamaoka et al. | ............. 365/181 |
| 2008/0181036 A1* | 7/2008 | Akiyama | ....................... 365/201 |
| 2009/0073782 A1* | 3/2009 | Hanafi et al. | ............. 365/189.09 |
| 2009/0190426 A1* | 7/2009 | Chuang et al. | ........... 365/210.11 |
| 2011/0063937 A1* | 3/2011 | Eid et al. | ........................ 365/226 |

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", IEEE Int'l Electron Devices Meeting (IEEE 2007), pp. 247-250.

Meixner et al., "Weak Write Test Mode: An SRAM Cell Stability Design for Test Technique", Proceedings of the Int'l Test Conference (IEEE, 1997), pp. 1043-1052.

Kerber et al., "Characterization of the Vt-Instability in $SiO_2/HFO_2$ Gate Dielectrics", IEEE Int'l Reliability Physics Symposium Proceedings (IEEE 2003), pp. 41-45.

Kalpat et al., "BTI Characteristics and Mechanisms of Metal Gated $HfO_2$ Films with Enhanced Interface/Bulk Process Treatments", Trans. on Device and Materials Reliability, vol. 5, No. 1 (IEEE, 2005), pp. 26-35.

U.S. Appl. No. 13/440,769, filed Apr. 5, 2012, entitled "Array Power Supply-Based Screening of Static Random Access Memory Cells for Bias Temperature Instability".

U.S. Appl. No. 13/196,010, filed Aug. 2, 2011, entitled "SRAM Cell Having a P-Well Bias".

U.S. Appl. No. 13/220,104, filed Aug. 29, 2011, entitled "Method of Screening Static Random Access Memories for Pass Transistor Defects".

\* cited by examiner

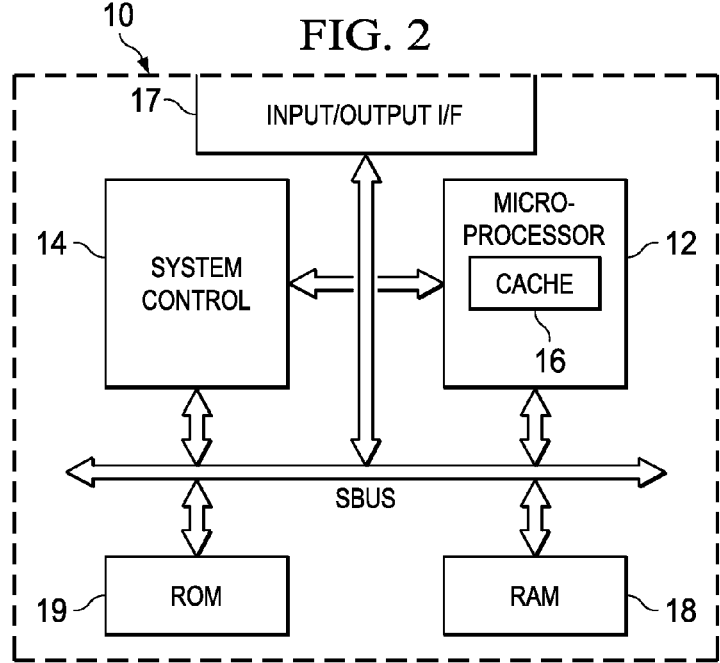
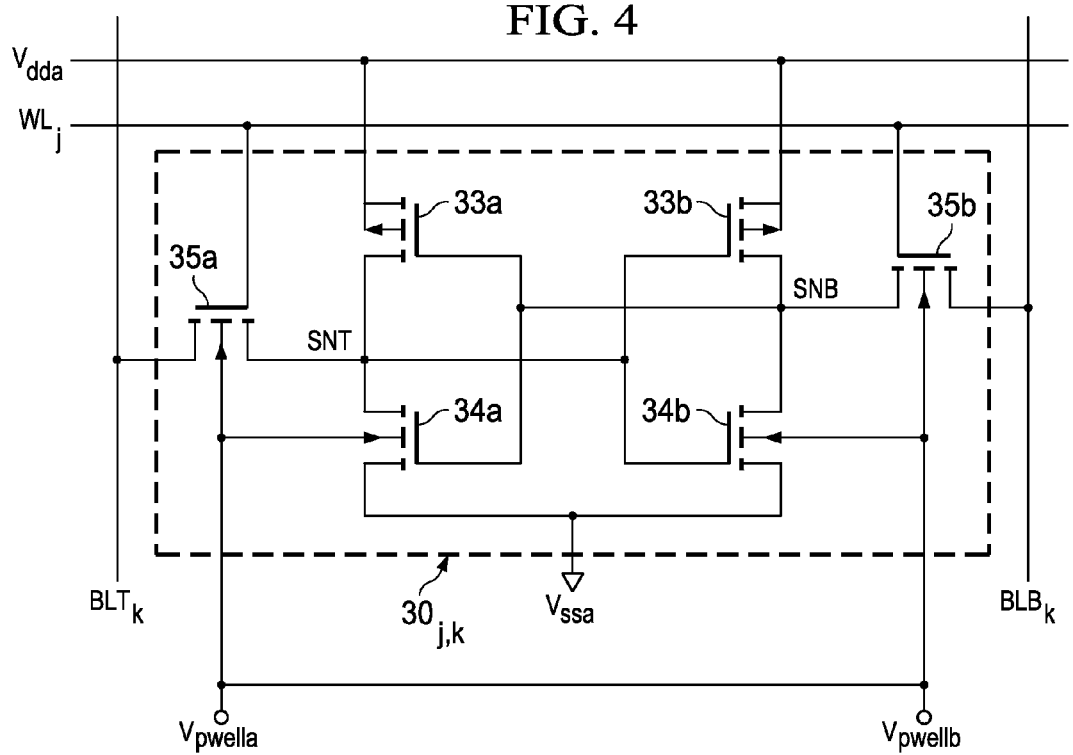

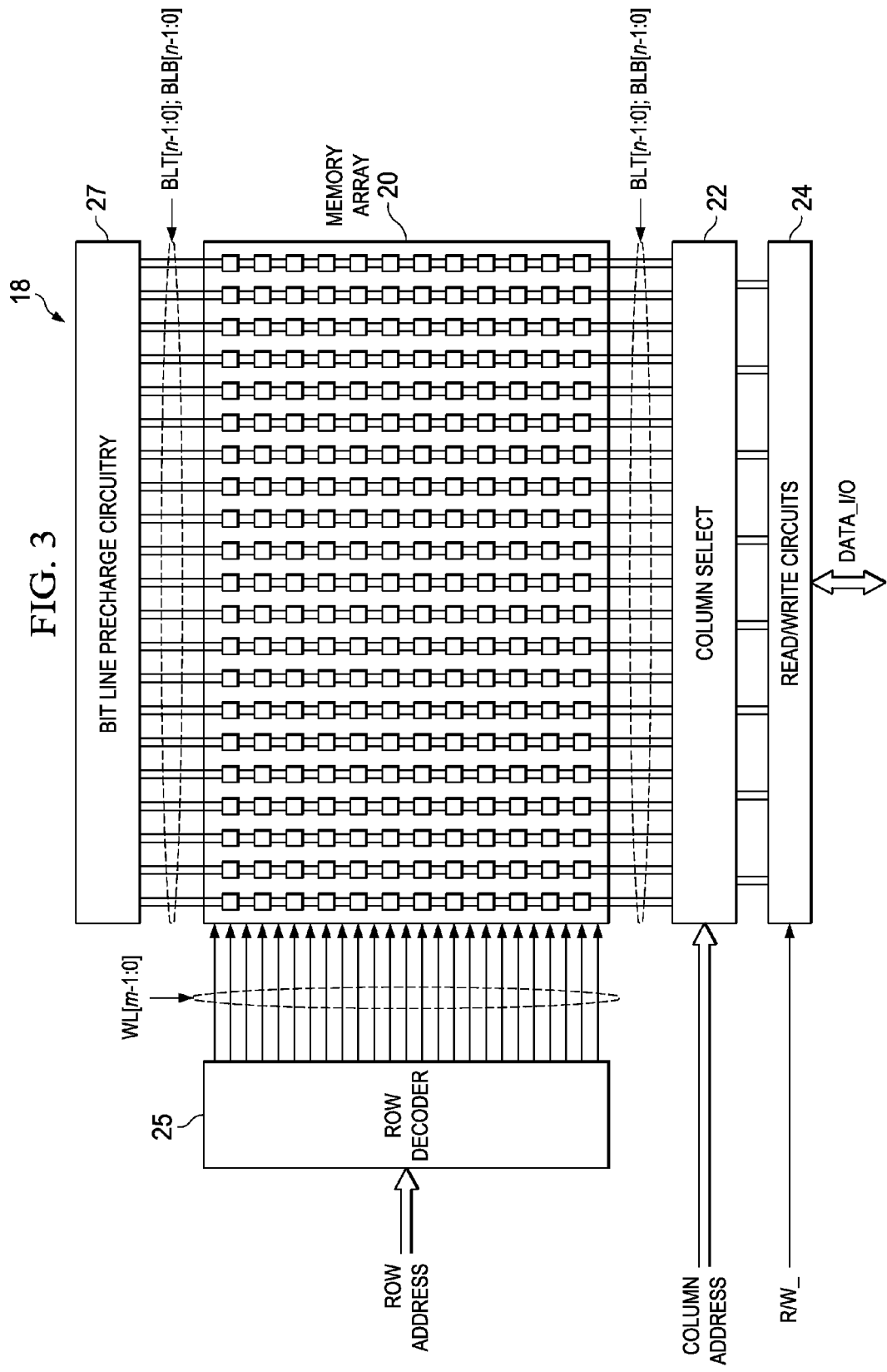

- 80 — WRITE "0" INTO ONE OR MORE CELLS UNDER TEST
- 82 — APPLY REVERSE BODY-NODE BIAS TO ISOLATED P-WELLS OF "0" SIDE DRIVER IN CELLS UNDER TEST
- 83 — APPLY FORWARD BODY-NODE BIAS TO OTHER NMOS TRANSISTORS (OPTIONAL) *(dashed)*
- 84 — DISTURB CELLS UNDER TEST
- 86 — APPLY RELAXED TEST CONDITIONS TO CELLS UNDER TEST
- 87 — READ CELLS UNDER TEST
- 88 — BOTH DATA STATES TESTED?
  - NO → 89 — WRITE "1" INTO CELLS UNDER TEST → (loop back to 80)
  - YES → end

- 90 — WRITE "0" INTO ONE OR MORE CELLS UNDER TEST
- 92 — APPLY REVERSE BODY-NODE BIAS TO ISOLATED P-WELLS OF "1" SIDE PASS TRANSISTOR AND DRIVER IN CELLS UNDER TEST
- 93 — APPLY FORWARD BODY-NODE BIAS TO "0" SIDE DRIVER (OPTIONAL) *(dashed)*
- 94 — WRITE OPPOSITE DATA STATE TO CELLS UNDER TEST
- 96 — APPLY RELAXED TEST CONDITIONS TO CELLS UNDER TEST
- 97 — READ CELLS UNDER TEST
- 98 — BOTH DATA STATES TESTED?
  - NO → 99 — WRITE "1" INTO CELLS UNDER TEST → (loop back to 90)
  - YES → end

1

METHOD OF SCREENING STATIC RANDOM ACCESS MEMORY CELLS FOR POSITIVE BIAS TEMPERATURE INSTABILITY

CROSS-REFERENCE TO RELATED APPLICATIONS

This application claims priority, under 35 U.S.C. §119(e), of Provisional Application No. 61/530,131, filed Sep. 1, 2011, which is incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to the manufacture and testing of static random access memories (SRAMs).

Many modern electronic devices and systems now include substantial computational capability for controlling and managing a wide range of functions and useful applications. Considering the large amount of digital data often involved in performing the complex functions of these modern devices, significant solid-state memory capacity is now commonly implemented in the electronic circuitry for these systems. Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

An example of a conventional SRAM cell is shown in FIG. 1a. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel load transistor 3a and n-channel driver transistor 4a, and the other inverter of series-connected p-channel load transistor 3b and n-channel transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel pass-gate transistor 5a has its source/drain path connected between storage node SNT and bit line $BLT_k$ for the $k^{th}$ column, and n-channel pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

In operation, bit lines $BLT_k$, $BLB_k$ are typically precharged by precharge circuitry 7 to a high voltage $V_{ddp}$ (which is at or near power supply voltage $V_{dda}$) and are equalized to that voltage; precharge circuitry 7 then releases bit lines $BLT_k$, $BLB_k$ to then float during the remainder of the access cycle. To access cell 2 for a read operation, word line $WL_j$ is then energized, turning on pass-gate transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

As mentioned above, device variability and other factors can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node SNT of cell 2 of FIG. 1a, if bit line $BLT_k$ is unable to sufficiently discharge storage node SNT to a sufficient level to trip the inverters, cell 2 may not latch to the desired data state. One cause of a write failure is weakness in the drive of a pass transistors (transistors 5a, 5b of cell 2). For the example in which cell 2 of FIG. 1a is initially storing a "0" state (storage node SNT held low by driver transistor 4a in its on state), a write of the opposite "1" state is performed by bit line $BLB_k$ being pulled low while word line $WL_j$ is energized. If the drive of pass transistor 5b is weak, storage node SNB will tend to remain at a high level despite the low level of bit line $BLB_k$. The apparent trip voltage $V_{trip}$ at bit line $BLB_k$ that actually causes a successful write will thus be lower than optimal, due to the weakness of pass transistor 5b. It has been observed that write failures (i.e., the measure $V_{trip}$) has a worst case at low temperature.

Cell stability failures are the converse of write failures—while a write failure occurs if a cell is too stubborn in changing its state, a cell stability failure occurs if a cell changes its state too easily during a read. A cell stability failure also occurs if a write to a selected memory cell causes a false write of data to unselected cells in that same row (i.e., to the "half-selected" cells in unselected columns of the selected row). The possibility of such stability failures is exacerbated by device mismatch and variability, as discussed above.

A useful quantitative measure of cell stability is referred to as static noise margin (SNM), which corresponds to the noise at a storage node that the cell can tolerate without changing its logic state, and can be approximated by the area of the largest square that fits between transfer characteristics for the two state transitions. In the familiar fashion, the butterfly curves of FIG. 1b illustrate the voltages at storage nodes SNT, SNB of cell 2 in their two potential data states, and transitions between the two. In this example, the "1" data state is at stable point DS1 at which voltage $V_{SNT}$ at storage node SNT is near power supply voltage $V_{dda}$ and voltage $V_{SNB}$ at storage node SNB is near ground ($V_{ssa}$); conversely, the "0" data state is at stable point DS0, with voltage $V_{SNB}$ near power supply voltage $V_{dda}$ and voltage $V_{SNT}$ near ground. Transfer characteristic $TF_{1-0}$ shows the voltages at storage nodes SNT, SNB for a transition from stable point DS1 to stable point DS0 (a "1" to "0" transition). Transfer characteristic $TF_{0-1}$ similarly shows the voltages at storage nodes SNT, SNB for the transition from stable point DS0 to stable point DS1 (a "0" to "1" transition). FIG. 1b illustrates static noise margin SNM for SRAM cell 2 as the area of the largest square that fits between transfer characteristics $TF_{1-0}$, $TF_{0-1}$.

Cell stability failures (i.e., insufficient static noise margin) can occur in cases in which the drive of the SRAM cell driver transistors (transistors 4a, 4b of cell 2 in FIG. 1a) is mismatched, with one driver transistor having decreased drive relative to its associated pass transistor (transistors 5a, 5b, respectively). For the example in which cell 2 of FIG. 1a is storing a "0" state (storage node SNT low), if driver transistor 4a has weakened drive relative to its pass transistor 5a, the voltage divider of these two devices when on in a read cycle will reflect a higher than optimal voltage at storage node SNT; this higher voltage will tend to turn driver transistor 4b on, which would flip the state of cell 2. It has been observed that cell stability has a worst case at high temperature.

The level of reliability required of integrated circuits has increased to new heights in recent years, especially in certain applications such as automotive systems. This enhanced reliability level has increased the extent to which integrated circuit manufacturers implement time-zero screens to remove (or repair, by way of redundant memory cells and circuit functions) those devices that are vulnerable to failure over the expected operating life of the device. A conventional approach in such screening is to apply "guardbands" on certain applied voltages during functional or parametric tests of circuit functions. In many cases, guardbanded voltages are implemented to account for the temperature dependence of circuit behavior, to enable the manufacturer to perform functional testing at one temperature (preferably room temperature) with confidence that the circuit will perform according to specification over the full specified temperature range, over the expected operating life. As known in the art, it is becoming increasingly difficult to design the appropriate test "vectors" (i.e., combinations of bias and internal circuit voltages, and other test conditions) that identify devices that are vulnerable to failure over time and temperature, without significant yield loss of devices that would not fail over operating life yet fail the screen at the applied guardbanded test vectors.

This difficulty is exacerbated by transistor degradation mechanisms that have become observable at the extremely small minimum feature sizes in modern integrated circuits. An important mechanism in this regard is negative bias temperature instability ("NBTI"), which appears as an increase in threshold voltage over time, primarily in p-channel MOS transistors. In the context of CMOS SRAMs, NBTI degradation affects the ability of memory cells to store and retain data. Conventional manufacturing test flows for sub-micron CMOS SRAMs now commonly include screens to identify (or invoke repair via redundant rows or columns) memory cells that are close to a pass/fail threshold at manufacture, within a margin corresponding to the expected NBTI drift over the desired operating life.

Copending U.S. application Ser. No. 13/189,675, filed Jul. 25, 2011, commonly assigned herewith and incorporated herein by reference, describes a screening method for testing solid-state memories for the effects of long-term shift due to NBTI in combination with random telegraph noise (RTN), in the context of SRAM cells As described in that application, each memory cell in the array is functionally tested with a bias voltage (e.g., the cell power supply voltage) at a first guardband that is sufficient to account for worst case long-term shift and RTN effects. Cells failing the first guardband test are then repeatedly tested with the bias voltage at a second guardband that is less severe than the first; those previously failed cells that pass this second guardband are considered to not be vulnerable to RTN effects. This approach avoids the over-screening of conventional test methods that apply an unduly severe guardband, while still identifying vulnerable memory cells in the population for repair or as failed devices.

By way of further background, it is known in the art to apply a voltage higher than the power supply voltage to the body nodes of the p-channel load transistors during the test of SRAM arrays. This condition is referred to in the art as a "reverse back-bias" condition, and is typically applied to the n-well regions in which the load transistors are formed. As fundamental in the art, this reverse back-bias voltage has the effect of increasing the threshold voltage of the load transistors, and thus reducing their source-drain drive at a given source-drain voltage and gate-source voltage. Such a test is performed with the intent of screening out cells that are vulnerable to increased threshold voltage over operating time caused by NBTI.

Positive bias-temperature instability ("PBTI") refers to a similar degradation effect that primarily affects n-channel MOS transistors. It has been observed, however, that degradation due to PBTI of n-channel transistors with silicon dioxide gate dielectrics is very slight, especially as compared to the NBTI degradation of p-channel transistors in the same circuits. As such, PBTI is typically not a significant reliability concern in conventional gate oxide technologies.

Recently, however, the continuing demand for ever-smaller device geometries has led to the more widespread use of high-k gate dielectric films (i.e., gate dielectric materials with a high dielectric constant relative to that of silicon dioxide). These high-k gate dielectric films, which enable the formation of thicker gate dielectrics with excellent gate characteristics, are typically used in conjunction with metal gate electrodes, rather than polysilicon gates, due to such effects as polysilicon depletion. A common high-k dielectric film used in the art is hafnium oxide ($HfO_2$). Examples of the metal gate material in modern device technologies include titanium nitride (TiN), tantalum-silicon-nitride ($Ta_xSi_yN$), and tantalum carbide ($TaC_x$).

It has been observed, however, that high-k metal gate n-channel MOS transistors are vulnerable to threshold voltage shifts due to PBTI, even though their conventional gate dielectric n-channel devices are not. This vulnerability is believed due to the affinity of $HfO_2$ films to trap electrons under positive gate bias (relative to the transistor channel region). As in the case of NBTI, the effect of PBTI on high-k metal gate n-channel MOS transistors is an increase in threshold voltage over time. And PBTI degradation of the n-channel cell transistors can cause read current failures in read cycles, in which weakened read current causes an insufficient differential signal to be developed across bit lines and results in an incorrect data state being read.

It has been discovered, in connection with this invention, that it is difficult to derive an accurate time-zero screen to identify those memory cells (i.e., constructed in high-k metal gate n-channel MOS) for which PBTI degradation will cause write failures, cell stability failures, or read current failures. To the extent that potential proxies for this effect are available, modern reliability goals may require an excessively harsh screen margin (e.g., guardband voltages above the maximum operating voltages) that itself may degrade long-term reliability. In addition, the undue yield loss of devices that fail such a screen but would, in fact, not have degraded to failure, can be substantial.

By way of further background, copending U.S. application Ser. No. 13/196,010, filed Aug. 2, 2011, entitled "SRAM Cell Having a P-Well Bias", commonly assigned herewith and incorporated herein by reference, describes a CMOS SRAM cell in which the complementary n-channel MOS driver transistors are constructed in p-type wells that are isolated from one another. The n-channel pass transistors may be also constructed in respective isolated p-wells, or may each share a p-well with one of the driver transistors. This application also describes performing operations in which one or more of the isolated p-wells for the driver transistors are more negatively biased during read cycles. Positive bias applied to the isolated p-wells for one or more of the pass transistors in write cycles is also disclosed.

By way of further background, copending U.S. application Ser. No. 13/220,104, filed Aug. 29, 2011, entitled "Method of Screening Static Random Access Memories for Pass Transistor Defects", commonly assigned herewith and incorporated herein by reference, describes a method of screening SRAM arrays to identify memory cells with bit line side pass transistor defects. After writing a known data state to the memory cells under test, a forward back-bias is applied to the load transistors of those cells, to reduce the load transistor threshold voltage. This forward back-bias is applied by raising the voltage of the n-well in which the p-channel load transistors are formed, above the voltage at the source nodes of those transistors, which strengthens the drive of the "on" load transistor (for the stored data state). A write of the opposite data state is then performed, followed by a read of the memory cells. The increased load transistor drive during write will tend to cause write failures for those cells having a pass transistor with weakened drive due to a bit line side defect.

BRIEF SUMMARY OF THE INVENTION

Embodiments of this invention provide a solid-state static random access memory (SRAM) and a method of operating the same by way of which memory cells that are susceptible to later-life failure caused by positive-bias temperature instability (PBTI) can be identified.

Embodiments of this invention provide such a memory and method that can directly screen for PBTI-susceptible memory cells, rather than by way of an approximation or proxy.

Embodiments of this invention provide such a memory and method that are capable of accurately and efficiently identifying such susceptible memory cells so as to minimize unnecessary yield loss.

Embodiments of this invention provide such a memory and method that can be readily implemented into modern manufacturing technology without requiring a precision photolithography operation.

Embodiments of this invention provide such a memory and method that can incorporate threshold voltage temperature dependence into the screen, avoiding the need to test the memories at temperature.

Embodiments of this invention provide such a memory and method that is suitable for use in connection with high-performance CMOS manufacturing technologies such as high-k gate dielectric materials and metal gate electrodes.

Other objects and advantages of embodiments of this invention will be apparent to those of ordinary skill in the art having reference to the following specification together with its drawings.

Embodiments of this invention may be implemented in connection with a solid-state static random access memory (SRAM) constructed according to complementary metal-oxide-semiconductor (CMOS) technology. The SRAM cells are constructed as complementary CMOS inverters, in which the inverter driver transistors are fabricated in well regions that are electrically isolated from the same conductivity-type material in which transistors of the same channel conductivity outside of the memory array are constructed. For example, n-channel driver transistors in the SRAM cells are constructed in isolated p-wells relative to n-channel transistors outside of the memory array. Each memory cell is functionally tested by applying a body node bias (either forward or reverse) to the isolated well region of at least one of the driver transistors to increase or reduce the apparent threshold voltage of that driver transistor. From the viewpoint of an n-channel MOS driver transistor, forward body node bias corresponds to the body node voltage of the transistor being at a higher voltage than its source node; reverse body node bias is applied by a lower voltage at the body node than at the source node. Under that bias condition, the memory cell is functionally tested for one or more of the attributes of cell stability (i.e., static noise margin), writeability (i.e., trip voltage $V_{trip}$), and the like.

In some embodiments, the n-channel MOS transistors in a given SRAM cell are constructed in p-wells that are isolated from one another to allow asymmetric body node bias during the functional test, to further improve the screen conditions. For example, in one embodiment, the driver transistors are constructed in p-wells that are isolated from that of their associated n-channel pass transistors.

BRIEF DESCRIPTION OF THE SEVERAL VIEWS OF THE DRAWING

FIG. 1b is a voltage plot illustrating the concept of static noise margin (SNM) in the SRAM cell of FIG. 1a.

FIG. 2 is an electrical diagram, in block form, of an integrated circuit including one or more memory resources suitable for testing according to embodiments of this invention.

FIG. 3 is an electrical diagram, in block form, of a memory in the integrated circuit of FIG. 2 suitable for testing according to embodiments of this invention.

FIG. 4 is an electrical diagram, in schematic form, of an SRAM cell suitable for testing according to embodiments of this invention.

FIGS. 9a and 9b are flow diagrams of screens within the test method of FIG. 6 for testing the SRAM cell of FIG. 8, according to that embodiment of this invention.

DETAILED DESCRIPTION OF THE INVENTION

Figure 1A:
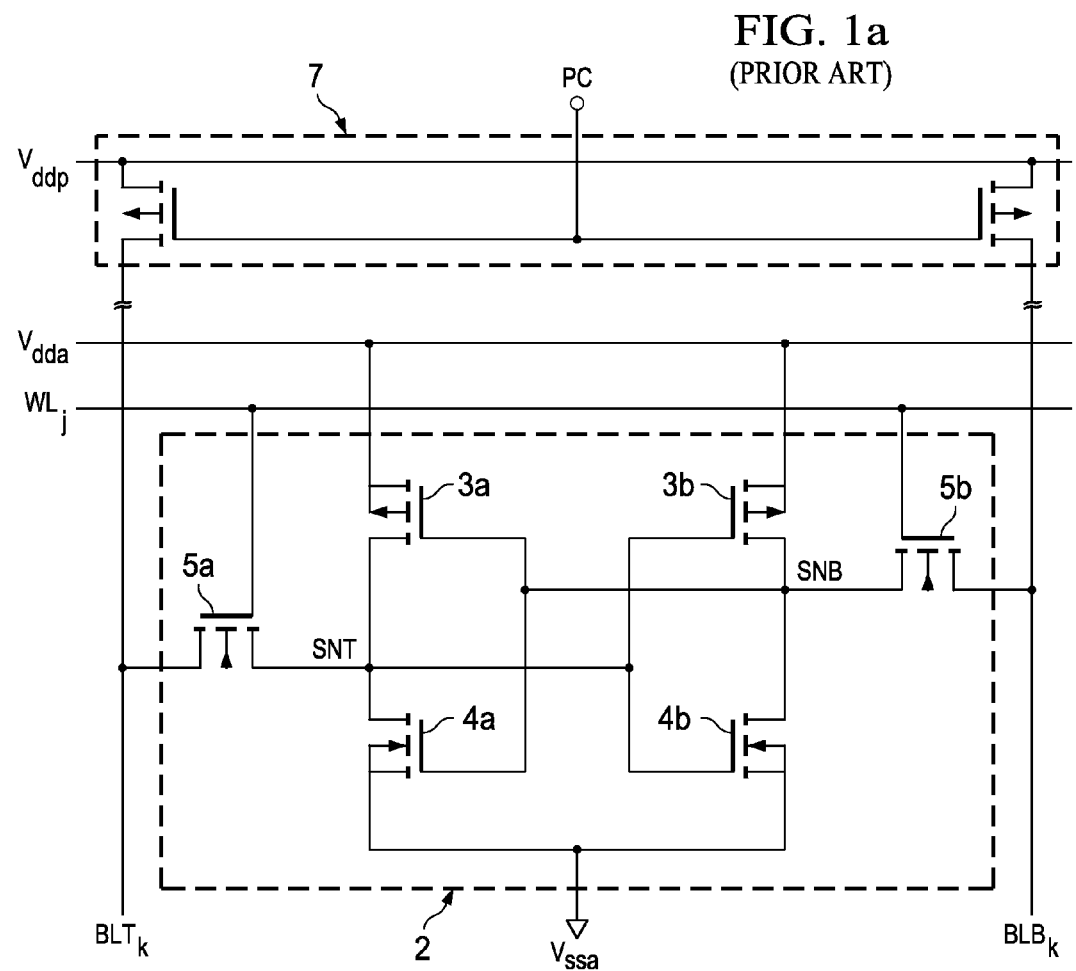
FIG. 1a is an electrical diagram, in schematic form, of a conventional static random access memory (SRAM) cell.
Figure 1B:
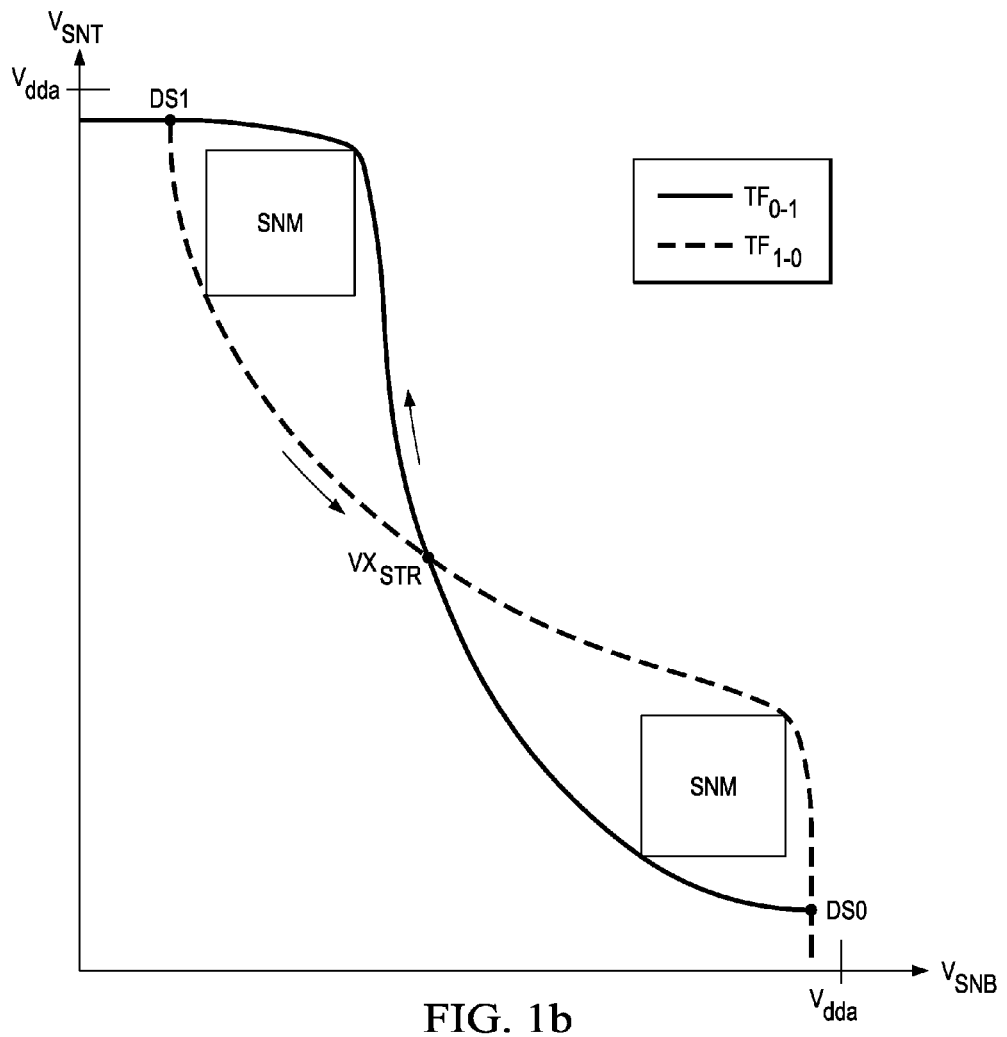

This invention will be described in connection with certain embodiments, namely as implemented into a method of testing static random access memories, because it is contemplated that this invention will be especially beneficial when used in such an application. However, it is also contemplated that embodiments of this invention will also be beneficial if applied to memories of other types, including read-only memories and electrically programmable read-only memories, among others. Furthermore, it is contemplated that embodiments of this invention may be used to test and screen circuit functions other than memories, including especially digital logic functions. Accordingly, it is to be understood that the following description is provided by way of example only, and is not intended to limit the true scope of this invention as claimed.

FIG. 2 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and read-only memory (ROM) 19, reside on system bus SBUS and are thus accessible to microprocessor 12. In many modern implementations, ROM 19 is realized by way of electrically erasable programmable read-only memory (EEPROM), a common type of which is referred to as "flash" EEPROM. As will be described in further detail below, realization of at least part of ROM 19 as flash EEPROM can facilitate the implementation and operation of embodiments of this invention. In any case, ROM 19 typically serves as program memory, storing the program instructions executable by microprocessor 12, while RAM 18 serves as data memory; in some cases, program instructions may reside in RAM 18 for recall and execution by microprocessor 12. Cache memory 16 (such as level 1, level 2, and level 3 caches, each typically implemented as SRAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of this invention.

Further detail in connection with the construction of RAM 18 in integrated circuit 10 is illustrated in FIG. 3. Of course, a similar construction may be used to realize other memory resources such as cache memory 16; further in the alternative, RAM 18 may correspond to a stand-alone memory integrated circuit (i.e., rather than as an embedded memory as shown in FIG. 2). Those skilled in the art having reference to this specification will comprehend that the memory architecture of RAM 18 in FIG. 3 is provided by way of example only.

In this example, RAM 18 includes many memory cells arranged in rows and columns within memory array 20. While a single instance of memory array 20 is shown in FIG. 3, it is to be understood that RAM 18 may include multiple memory arrays 20, each corresponding to a memory block within the address space of RAM 18.

In the example shown in FIG. 3, memory array 20 includes m rows and n columns of SRAM cells, with cells in the same column sharing a pair of bit lines BLT[n−1:0], BLB[n−1:0], and with memory cells in the same row sharing one of word lines WL[m−1:0]. Bit line precharge circuitry 27 is provided to apply a desired precharge voltage to the pairs of bit lines BLT[n−1:0], BLB[n−1:0] in advance of read and write operations. Row decoder 25 receives a row address value indicating the row of memory array 20 to be accessed, and energizes the one of word lines WL[m−1:0] corresponding to that row address value. Column select circuit 22 receives a column address value, and in response selects pairs of bit lines BLT[n−1:0], BLB[n−1:0] associated with one or more columns to be placed in communication with read/write circuits 24. Read/write circuits 24 are constructed in the conventional manner, for example to include the typical differential amplifier coupled to the bit lines for a column as selected by column select circuit 22 and a write circuit for selectively pulling toward ground one of the bit lines in the selected pair. The example of RAM 18 shown in FIG. 3 is constructed to an "interleaved" architecture, in which a given memory address selects one of every x (e.g., one of every four) columns for read or write access. The data words stored in memory array 20 are thus interleaved with one another, in the sense that the memory address decoded (in part) by column select circuit 22 selects one column in each group of columns, along the selected row. Alternatively, memory array 20 may be arranged in a non-interleaved fashion, in which each cell in the selected row is coupled to a corresponding read/write circuit in each cycle. In that architecture, read/write circuits 24 could reside between bit lines BL[n−1:0], and column select circuits 22, with the column select circuits selecting which read/write circuits 24 (and thus which columns) are in communication with data bus DATA I/O.

As discussed above in connection with the Background of the Invention, modern integrated circuits are now commonly constructed with extremely small minimum sized features, for example with metal-oxide-semiconductor (MOS) transistor gates having widths deep in the sub-micron regime. While these small feature sizes provide tremendous cell density and, in many respects, high device performance, reliability and stability issues also result from such scaling. As such, it has become no less important to properly screen, at the time of manufacture, memory arrays and other circuit functions in order to identify and repair, or remove from the population, those memory cells and devices that are vulnerable to failing the desired specifications over operating life. For RAM 18 constructed as described above, measures such as static noise margin, writeability (i.e., $V_{trip}$), and the like are of particular concern over the expected operating life.

Furthermore, the extreme thinness required of conventional gate dielectric layers (e.g., silicon dioxide) as transistor feature sizes have scaled into the deep submicron realm has rendered those materials unusable in many cases. In response, so-called "high-k" gate dielectrics, such as hafnium oxide ($HfO_2$), have higher dielectric constants than silicon dioxide and silicon nitride, permitting those films to be substantially thicker than the corresponding silicon dioxide gate films while remaining suitable for use in high performance MOS transistors. Gate electrodes of metals and metal compounds, such as titanium nitride, tantalum-silicon-nitride, tantalum carbide, and the like are now also popular in modern MOS technology, especially in combination with high-k gate dielectrics. These metal gate electrodes eliminate effects such as polysilicon depletion, such effects being noticeable at the extremely small feature sizes required of these technologies.

However, it has been observed that modern high-k metal gate n-channel MOS transistors are susceptible not only to negative bias temperature instability ("NBTI") as are conventional gate dielectric devices, but also to positive bias temperature instability ("PBTI"). As known in the art, NBTI primarily affects p-channel MOS transistors such as load transistors $3a$, $3b$, in the conventional cell of FIG. $1a$, because the gate electrode of a p-channel MOS transistor is at a voltage at or below that of the transistor channel (i.e., body node), hence the "negative bias". Conversely, PBTI primarily affects n-channel MOS transistors such as driver transistors $4a$, $4b$, in which the gate electrode is typically at a voltage at or above that of the transistor body node. PBTI effects are generally insignificant in conventional gate dielectric transistors, as compared with NBTI degradation. Both NBTI and PBTI are reflected by increasing transistor threshold voltage, and thus decreasing transistor drive in the "on" state, over operating life.

It has been observed, through simulation, that PBTI threshold voltage shifts at n-channel driver transistors $4a$, $4b$ in a conventional 6-T CMOS SRAM cell such as cell $2$ of FIG. $1a$ can degrade static noise margin. Consider, for example, the case of cell $2$ storing a "0" data state (storage node SNT at ground $V_{ssa}$, and storage node SNB at power supply voltage $V_{dda}$). If the threshold voltage of driver transistor $4a$ has increased, due to PBTI, to the extent that its drive is significantly weakened, it will be easier for a the reduced differential voltage developed at storage nodes SNT, SNB during a read (i.e., upon pass transistors $5a$, $5b$ turned on by word line $WL_j$) to disrupt the stored "0" level at storage node SNT. This effect is reflected by degradation of the static noise margin of cell $2$.

It has also been observed, through simulation, that PBTI threshold voltage shifts at n-channel pass transistors $5a$, $5b$ can degrade the trip voltage $V_{trip}$ of cell $2$, which renders writes more difficult. Consider, for example, the case of a write of a "1" data state to cell $2$ that is initially storing a "0" data state (i.e., initially with a low level at storage node SNT). If the threshold voltage of pass transistor $5b$ has increased due to PBTI, and its drive thus significantly weakened, its ability to couple a low write voltage from bit line $BLB_k$ to storage node SNB during the write cycle will be reduced. This results in a reduction of the apparent trip voltage $V_{trip}$ of cell $2$ necessary for the write to take place.

Accordingly, it would be useful to screen CMOS SRAM cells to identify and repair, or discard, those memory cells and memories that are sufficiently marginal in static noise margin or $V_{trip}$ level, among other attributes, that transistor degradation over the expected operating life would result in the loss of a stored data state, a write failure, or a reduced read current-induced sense failure. It is particularly useful to provide such a screen in the case of SRAM cells constructed of high-k gate dielectric metal gate re-channel MOS transistors, due to their additional susceptibility to PBTI. Regardless of the screen, it is important to the manufacturer that such screens accurately test for the contemplated degradation mechanisms and effects, without significant overkill and thus undue yield loss.

However, conventional SRAM cells and memories are not constructed to readily screen for these measures of SNM and $V_{trip}$, especially as those measures may be affected by PBTI at the n-channel driver transistors. As such, conventional test vectors necessarily incorporate certain "proxies" for the effects of shifting device parameters, such as shifts in threshold voltage of n-channel driver transistors of SRAM cells. Examples of such proxies include increased precharge voltages at bit lines $BLT_k$, $BLB_k$ and reduced power supply voltage $V_{dda}$. However, the extent to which the bit line voltage must be increased and to which power supply voltage $V_{dda}$ must be decreased, in order to properly screen for such effects as PBTI, especially at the extremes of the temperature range, is believed to present an unrealistic bias condition to the cells under test. Such unrealistic test vectors have been observed to introduce other unintended effects and failure modes for the cells, beyond those related to transistor threshold shift, including potential degradation of long-term reliability. In addition, the necessary test vector voltages that may be applied by level shifters and other peripheral circuits in the memory architecture are often limited, by virtue of the design and capability of those peripheral circuits.

For the case of PBTI "proxy" screening, the ability to increase the reverse body node bias of load transistors $3a$, $3b$ (for example by increasing the voltage of the n-well voltage in which those p-channel MOS transistors are formed) is available in some architectures. However, this increased reverse body node bias increases the likelihood of "punchthrough" between the n-well receiving the increased bias, and n+ source/drain regions in neighboring p-type regions, such as in driver transistors $4a$, $4b$ and pass transistors $5a$, $5b$. And because of the approximations involved with these proxies, the screen margin necessary to meet the desired reliability target (i.e., devices per million failing prior to end-of-life due to PBTI) becomes so excessive as to cause significant yield loss from memories that would not eventually fail due to PBTI, but which fail the time-zero screen.

According to embodiments of this invention, CMOS SRAM cells are constructed to enable a more direct screen for transistor threshold instability, including the effects of PBTI where applicable, on the n-channel MOS driver transistors. FIG. $4$ illustrates an example of the construction of memory cell $30$ of memory array $20$, according to embodiments of this invention. Cell $30_{jk}$ includes, in the conventional manner, one CMOS inverter constructed from series-connected p-channel load transistor $33a$ and n-channel driver transistor $34a$, and another CMOS inverter of series-connected p-channel load transistor $33b$ and n-channel transistor $34b$. The gates of transistors $33a$, $34a$ in one inverter are connected together and to the common drain node of transistors $33b$, $34b$ of the opposite inverter at storage node SNB; similarly, the gates of transistors $33b$, $34b$ are connected together and to the common drain node of transistors $33a$, $34a$ at storage node SNT. N-channel pass-gate transistors $35a$, $35b$ have their source/drain paths connected between storage nodes SNT, SNB, respectively, and respective bit lines $BLT_k$, $BLB_k$ for column k of array $20$. Word line $WL_j$ for row j controls the gates of transistors $35a$, $35b$.

According to embodiments of this invention, the body nodes of driver transistor $34a$ and driver transistor $34b$ are isolated from those of n-channel transistors outside of memory array $20$, and can be separately biased from those of transistors in those other circuits and functions. For example, as shown in FIG. $4$, the body nodes of n-channel driver transistor $34a$ and n-channel pass transistor $35a$ are connected together and biased by a voltage $V_{pwella}$. Similarly, the body nodes of n-channel driver transistor $34b$ and n-channel pass transistor $35b$ are connected together and biased by a voltage $V_{pwellb}$. As will be described in further detail below, driver transistors 34a, 34b are formed within isolated p-well regions, which enable the ability to modulate the body node voltages $V_{pwella}$, $V_{pwellb}$.

The body nodes of transistors 34a, 35a may be connected to the body nodes of transistors 34b, 35b (i.e., body node voltages $V_{pwella}$, $V_{pwellb}$ equal) as suggested in FIG. 4, or alternatively the body nodes of transistors 34a, 35a may be isolated from the body nodes of transistors 34b, 35b. It is contemplated that the application of asymmetric body node voltages $V_{pwella}$, $V_{pwellb}$ during functional test may improve the ability of the screen to mimic threshold voltage shifts, but the layout of RAM 18 must be arranged to accommodate the separately routed well voltages. It is contemplated that those skilled in the art having reference to this specification will be readily able to evaluate the tradeoff between efficacy of the screen with that additional degree of freedom, and the additional chip area and routing complexity necessary to separately bias the opposing p-wells.

Further in the alternative, additional instances of isolated p-wells may be incorporated in the layout so that the body nodes of pass transistors 35a, 35b can be separately biased from the body nodes of their corresponding driver transistors 34a, 34b. An example of this isolation of the body nodes of all four n-channel transistors in a 6-T SRAM cell from one another is described in the above-incorporated copending U.S. application Ser. No. 13/196,010. An example of screens in which such separate bias is provided will be described below. This arrangement would, of course, require additional chip area to realize each SRAM cell $30_{jk}$; it is contemplated that those skilled in the art having reference to this specification would be readily able to implement a cell layout that accomplishes this separation.

Further in the alternative, it is contemplated that pass transistors 35a, 35b may be constructed as p-channel MOS transistors, in which case certain screens (e.g., static noise margin screen) described below in connection with embodiments of this invention will be applicable. Other alternative arrangements of SRAM cells are also well-suited for use in connection with embodiments of this invention, including 8-T SRAM cells and 10-T SRAM cells (each of which communicate with separate read and write bit lines), and the like. It is contemplated that those skilled in the art having reference to this specification will be able to readily adapt particular embodiments of this invention for such arrangements and variations, without undue experimentation. It is contemplated that those alternatives are within the scope of this invention.

Referring now to FIGS. 5a through 5d, the physical construction of SRAM cell $30_{jk}$ within memory array 20 according to an embodiment of the invention, and having the electrical arrangement described above relative to FIG. 4, will now be described. It is of course contemplated that the particular layout and construction of memory array 20 and its constituent SRAM cells 30 may vary significantly from that shown in FIGS. 5a through 5d and described herein, such variations and alternatives being apparent to those skilled in the art having reference to this specification, yet remain within the scope of this invention. It is therefore to be understood that this description of the architecture, layout, and construction of memory array 20 and SRAM cells 30 is provided by way of example only.

Figure 5A:
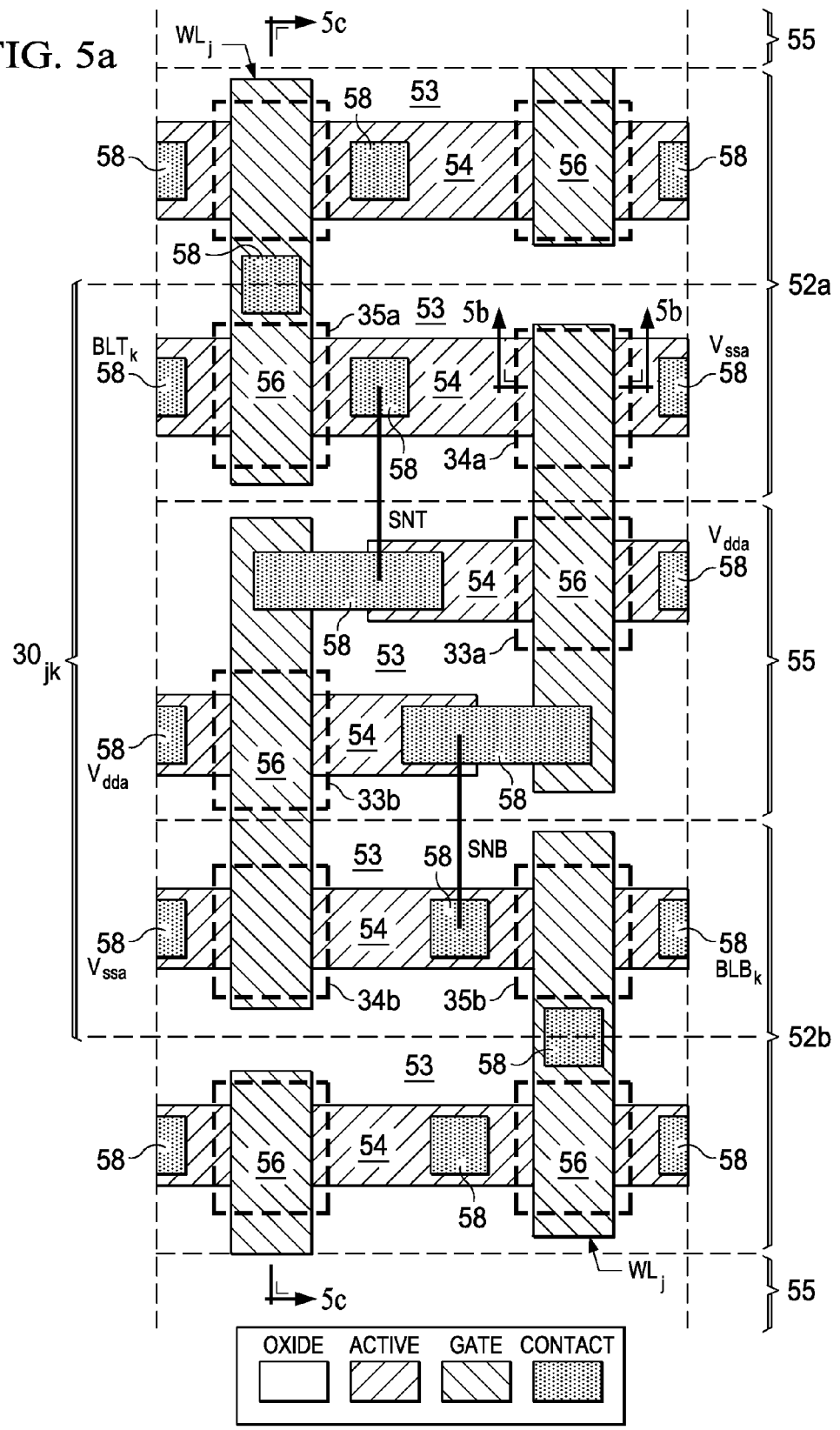
FIGS. 5a and 5d are plan views of a portion of the memory of FIG. 3 including the SRAM cell of FIG. 4.
Figure 5B:
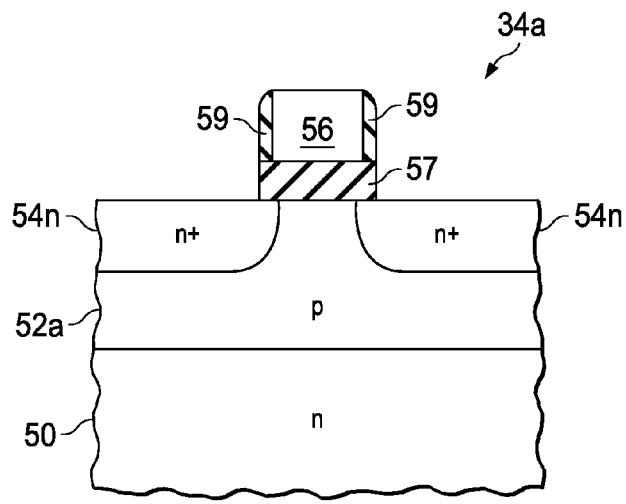
FIGS. 5b and 5c are cross-sectional views corresponding to FIGS. 5a and 5d, including the SRAM cell of FIG. 4.
Figure 5C:
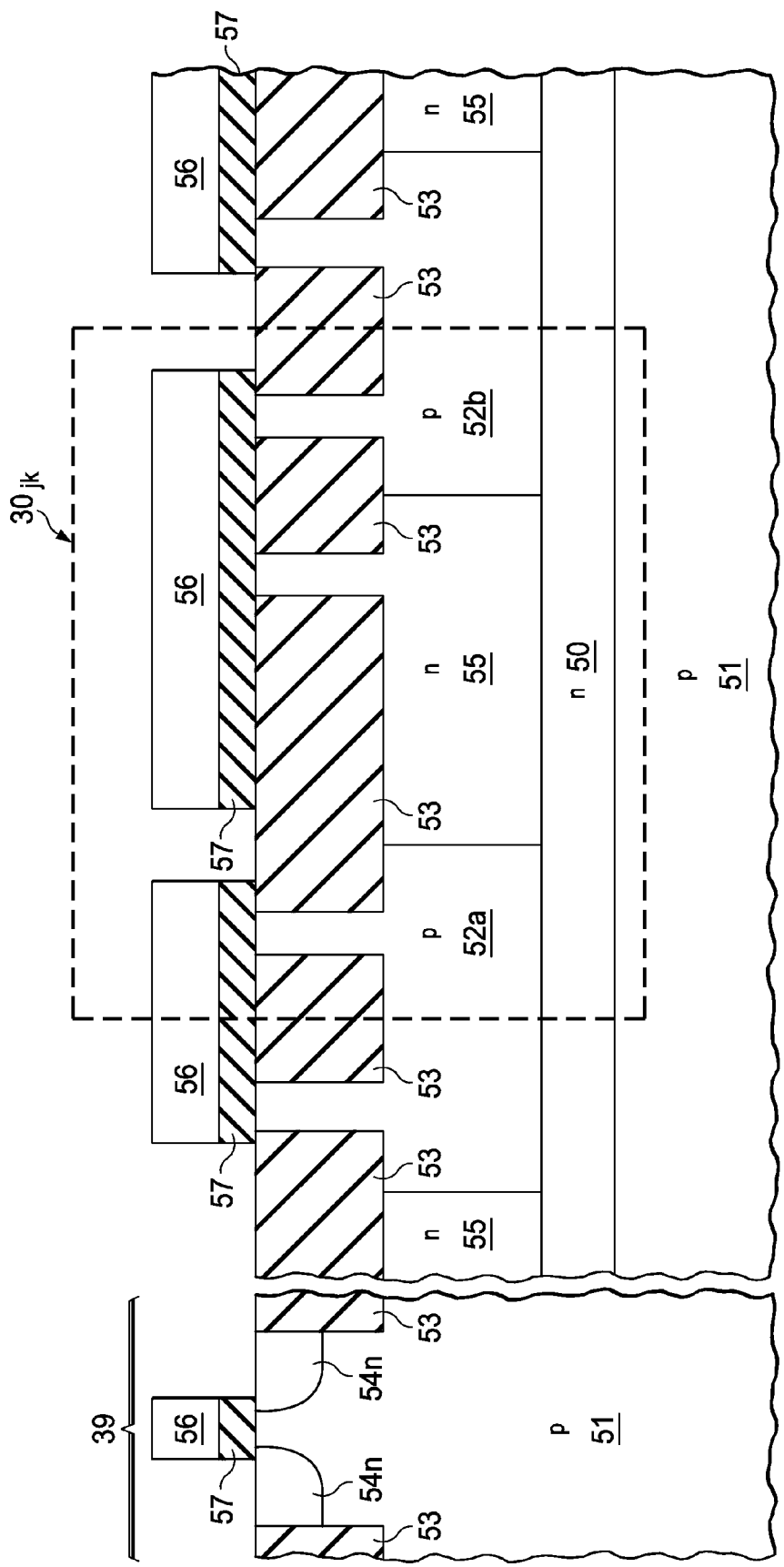

FIG. 5a is a plan view, and FIGS. 5b and 5c are cross-sectional views, of an example of the layout of memory cell $30_{jk}$ at the surface of a silicon substrate, fabricated according to CMOS technology and according to an embodiment of this invention, and at a stage in the manufacture prior to the formation of overlying metal layers. In this example, active regions 54 are locations of the surface of an n-well or a p-well, as the case may be, at which dielectric isolation structures 53 are not present. As known in the art, isolation dielectric structures 53 are relatively thick structures of silicon dioxide or another dielectric material, intended to isolate transistor source and drain regions in separate transistors from one another. Isolation dielectric structures 53 are typically formed by way of shallow trench isolation (STI) structures in modern high-density integrated circuits, or alternatively by the well-known local oxidation of silicon (LOCOS) process.

As well known in the art, transistors are formed at locations of active regions 54 that underlie gate elements 56. FIG. 5b illustrates, in cross-section, the construction of n-channel MOS driver transistor 34a, by way of example. As shown in FIG. 5b, transistor 34a is constructed at the surface of isolated p-well 52a, at a location at which gate element 56 (extending into and out of the page) crosses active region 54. Gate element 56 is separated from the surface of active region 54 by gate dielectric layer 57 as shown. N+ regions 54n are formed into the surface of active region 54 in the conventional self-aligned manner, by way of ion implantation and a subsequent activation anneal. If desired, sidewall dielectric filaments 59 may be formed on the sides of gate element 56, such sidewall filaments 59 used to separate the reach of separate source/drain ion implantation processes, to create graded junction ("lightly-doped drain") extensions of source/drain regions 54n. The portion of p-well 52a underlying gate element 56, and not doped by the source/drain implant and anneal, remains p-type and will serve as the channel region of transistors 34a.

Various materials may be used for gate element 56 and gate dielectric 57. Commonly used materials include polycrystalline silicon for gate element 56, and silicon dioxide or silicon nitride (or a combination of the two) for gate dielectric 57. Those conventional materials are suitable for use with embodiments of this invention. As mentioned above, however, silicon dioxide is becoming unsuitable for use in the deep sub-micron regime; high-k dielectric materials such as hafnium oxide ($HfO_2$) enable a thicker gate dielectric film (as suggested by gate dielectric 57 of FIG. 5b). Similarly, high-performance transistors required in modern integrated circuits now favor the use of metals or metal compounds for gate element 56, examples of which include titanium nitride, tantalum silicon nitride, and tantalum carbide. Other examples of these high-k gate dielectric materials and metal gate materials are known in the art. It is contemplated that embodiments of this invention are especially well-suited for use in connection with such modern transistor materials, particularly considering that these embodiments of the invention can readily screen for device instabilities such as PBTI, to which transistors using those modern materials have been observed to be susceptible.

Figure 5D:
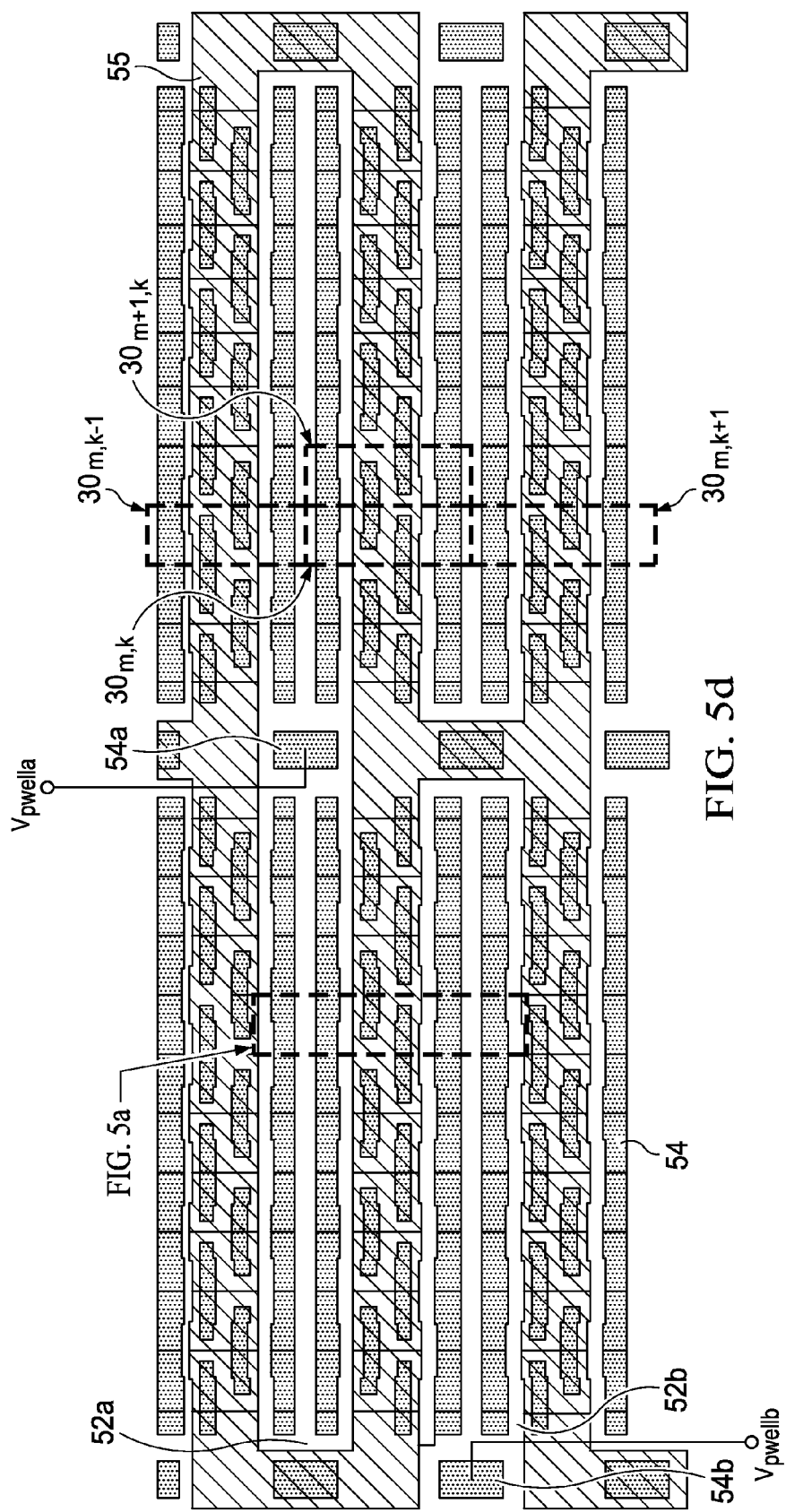

Referring back to FIG. 5a, the various n-well and p-well regions of this portion of memory array 20 are indicated. More specifically, isolated p-wells 52a, 52b are separated from one another by an instance of n-well 55, and are each separated from other p-wells 52 by other instances of n-wells 55. FIG. 5d illustrates, in plan view, a larger portion of memory array 20 than that shown in FIG. 5a. The portion shown in FIG. 5a is illustrated by dashed lines in FIG. 5d. As evident from FIG. 5d, isolated p-wells 52a, 52b each extend laterally (in the view of FIGS. 5a and 5d) for some distance, each encompassing several memory cells 30. According to this embodiment of the invention, isolated p-wells 52a, 52b are structurally isolated from one another by deep n-well 50. P-well 52a receives p-well bias voltage $V_{pwella}$ via a metal conductor (not shown) that makes contact to active region instance 54a (FIG. 5d) disposed within p-well 52a between groups of SRAM cells 30. Similarly, p-well 52b receives p-well bias voltage $V_{pwellb}$ via a metal conductor (not shown) that is connected to active region instance 54b (FIG. 5d).

FIG. 5a illustrates the locations of contact openings 58 that extend through overlying insulator material (not shown) to active regions 54 or to gate elements 56, at the case may be. Metal conductors (two of which are shown schematically in FIG. 5 for storage nodes SNT, SNB) will be patterned to form conductors that overlie the structure, making contact to active regions 54 or gate elements 56 (or both) via respective contact openings 58.

FIG. 5a illustrates the outline of the various transistors 33, 34, 35 within cell $30_{jk}$, corresponding to the electrical schematic of FIG. 4. As is fundamental in the art, MOS transistors are located at regions of the surface at which a gate element (i.e., poly element 56 in this example) overlies an instance of active region 54. It is contemplated that those skilled in the art will be able to follow the schematic of FIG. 4 within the layout of FIG. 5a, with reference to the identification of transistors 33, 34, 35 in FIG. 5a. For example, the metal conductor schematically shown as storage node SNB connects active region 54 at the drain of transistor 34b and one side of pass transistor 35b to active region 54 at the drain of transistor 33b and to gate element 56 serving as the gate of transistors 33a, 34a (via a shared contact opening 58). Similarly, the metal conductor schematically shown as storage node SNT connects active region 54 between transistors 34a, 35a to active region 54 at the drain of transistor 33a, and (via shared contact opening 58) to gate element 56 serving as the gates of transistors 33b, 34b. Power supply and ground voltages $V_{dda}$, $V_{ssa}$, and bit lines $BLT_k$, $BLB_k$, and word line $WL_j$ are connected, via metal conductors (not shown) and contact openings 58 to the appropriate elements within cell $30_{jk}$ as shown in FIG. 5a, according to the electrical schematic of FIG. 4.

As described above in the example of cell $30_{jk}$ shown in FIG. 4, re-channel transistors 34a, 35a, and transistors 34b, 35b, are formed in isolated p-well structures, such that these transistor pairs can receive separate body node bias voltages $V_{pwella}$, $V_{pwellb}$ from that of other n-channel MOS transistors in integrated circuit 10. These isolated p-well regions are typically not available in those MOS integrated circuits that are formed in p-type bulk silicon, as is popular in many CMOS manufacturing technologies, in which the same body node bias is necessarily applied to all n-channel MOS transistors in the integrated circuit, by way of the p-type bulk substrate. Typically, for ease of layout, each n-channel MOS transistors in such p-type bulk construction has its body node connected to its source node, which is often at a ground voltage ($V_{ssa}$) in CMOS logic and CMOS SRAM cells (as shown in FIG. 1a).

FIG. 5c illustrates, in cross-section, the construction of a portion of memory array 20 in integrated circuit 10, at which SRAM cell $30_{jk}$ is realized. As shown in FIG. 5c, deep n-well 50 is formed within p-type substrate 51, at a location underlying SRAM cell $30_{jk}$. Deep n-well 50 extends, in unitary fashion, under the entirety of memory array 20 in this embodiment of the invention. P-channel transistors in SRAM cells 30 are formed within corresponding n-wells 55, which extend from the surface of the structure to reach deep n-well 50. By extending to deep n-well 50, these n-wells 55 effectively surround islands of the p-type substrate on all sides and on the bottom, thus forming isolated p-wells 52a, 52b as shown in FIG. 5c. The p-type dopant concentration in these isolated p-wells 52a, 52b is essentially the same as p-type substrate 51 in this embodiment of the invention, as isolated p-wells 52a, 52b are simply walled-off regions of substrate 51.

As shown in FIG. 5c in this embodiment of the invention, deep n-well 50 is not formed over the entire chip area of integrated circuit 10. As such, n-channel transistors such as transistor 39 shown in FIG. 5c are present within p-type substrate 51, and receive the nominal body node bias (e.g., at the source node voltage). It is contemplated that n-channel transistors in the peripheral circuits (i.e., decoders, sense amplifiers, write circuits, precharge circuits, etc.) to memory array 20 in RAM 18 will be constructed similarly to transistor 39, thus receiving the nominal body node bias. Alternatively, these periphery circuit transistors may be constructed within isolated p-wells 52, if desired, but in that case it is contemplated that the body node bias applied to those transistors would differ from that applied to isolated p-wells 52 of SRAM cells 30 under test. In any case, this construction enables the body node bias applied to n-channel transistors within isolated p-wells 52 to be independent of the voltage of substrate 51. This permits the n-channel transistors in the periphery of RAM 18 to operate with nominal transistor characteristics, despite the varying body node bias applied to the array transistors 34, 35 within respective isolated p-wells 52. As will be described in further detail below, embodiments of this invention take advantage of the ability to independently bias the body node of transistors 34, 35 in memory array 20 in time-zero screening those SRAM cells $30_{jk}$ that are vulnerable to threshold voltage shifts and other instability mechanisms over operating life.

In manufacture, deep n-well 50 may be formed in the conventional manner for "diffusion-under-field" (or "DUF") structures in integrated circuits, such as by way of a masked ion implant of sufficient dose and energy to place the dopant ions at the desired depth, followed by an anneal to diffuse the implanted dopant as desired. Other methods for forming such buried doped regions, such as used in conventional bipolar manufacturing flows, may alternatively be used. In addition, it is known to include n-type buried layers such as deep n-well 50 in flash EEPROM arrays. As such, in the context of integrated circuit 10 of FIG. 2, if ROM 19 is constructed as flash EEPROM, the manufacturing process flow for integrated circuit 10 may already include the photolithography, implant, and diffusion processes required for forming deep n-well 50 in memory array 20 of RAM 18. In that case, the formation of deep n-well 50 for RAM 18 according to this embodiment of the invention will, to a large extent, be essentially "free" from the standpoint of manufacturing cost.

Referring to FIGS. 5a, 5b, and 5c in combination, therefore, SRAM cell $30_{jk}$ is formed into the surface of p-type substrate 51, into which n-well 55, isolated p-wells 52a, 52b, and deep n-well 50 have been formed. N-channel MOS transistors 34a, 35a, are formed into one isolated p-well 52a, and n-channel MOS transistors 34b, 35b are formed into another isolated p-well 52b. P-channel MOS transistors 33a, 33b are formed into n-well 55, which in this example lies between the two isolated p-wells 52a, 52b in cell $30_{jk}$. As will become evident from the following description, adjacent cells 30 can be formed on all four sides of cell $30_{jk}$. In the conventional manner, active regions 54 are defined at the surface, between isolation oxide structures 53 formed as LOCOS field oxide or as shallow trench isolation (STI) structures, also in the conventional manner.

FIG. 5d shows, in plan view, the layout of a portion of memory array 20 with respect to isolated p-wells 52a, 52b and n-well 55, and also showing active regions 54 defined within those wells 52a, 52b, 55; other levels are not shown in FIG. 5d for the sake of clarity. The region illustrated in FIG. 5a is indicated in FIG. 5d, as are some of SRAM cells 30. The orientation of the plan view of FIG. 5d is such that columns run horizontally and rows run vertically. For example, SRAM cell $30_{m,k}$ in row m and column k is highlighted. Above and below SRAM cell $30_{m,k}$ are cells $30_{m,k-1}$, $30_{m,k+1}$, which also reside in the same row m but in columns k and k+1, respectively. SRAM cell $30_{m+1,k}$ is along the right-hand side of cell $30_{m,k}$, residing in the same column k but in neighboring row m+1.

As evident from FIG. 5d, each of isolated p-wells 52a, 52b include n-channel transistors from multiple cells along the same column k, and also n-channel transistors in neighboring columns k−1 (for p-well 52a) and k+1 (for p-well 52b). Horizontally, each of p-wells 52a, 52b covers two groups of rows of cells 30, with an instance of active region 54 disposed between the two groups of rows within each of p-wells 52a, 52b, to support a contact to an applied voltage $V_{pwella}$, $V_{pwellb}$, respectively. The horizontal reach of p-wells 52a, 52b is staggered relative to one another, such that p-wells 52a, 52b serve both the group of rows including the cells shown in FIG. 5a, but each serve a different second group of rows as shown (i.e., p-well 52a serves row m, while p-well 52b does not). In this example, n-well 55 surrounds isolated p-wells 52a, 52b and all other isolated p-wells 52 within memory array 20, but is contiguous within memory array 20 by way of the regions disposed between groups of rows of cells 30.

While not shown in FIGS. 5a through 5d, a portion of n-well 55 (or another instance of an n-well, as the case may be) is necessary at the outer edge of memory array 20, to ensure the isolation of those p-wells 52 that extend to the array edge. And as mentioned above, it may be useful, from a layout and routing standpoint, for p-wells 52a, 52b to be connected together to receive the same body node bias voltage (i.e., bias voltage nodes $V_{pwella}$, $V_{pwellb}$ connected together so that voltage $V_{pwella}$=voltage $V_{pwellb}$). This condition can be used in the screens according to embodiments of this invention, as will be described below; it is contemplated, however, that separation of voltages $V_{pwella}$, $V_{pwellb}$ from one another could be beneficial in certain screens.

Of course, the construction of memory array 20 shown in FIGS. 5a through 5d is presented by way of example only, it being understood that the particular layout of SRAM cell $30_{jk}$ and memory array 20 can vary widely from that shown, depending on the particular manufacturing technology and design rules applicable to each implementation, and on the layout optimization arrived at by those skilled in that art.

Figure 6:
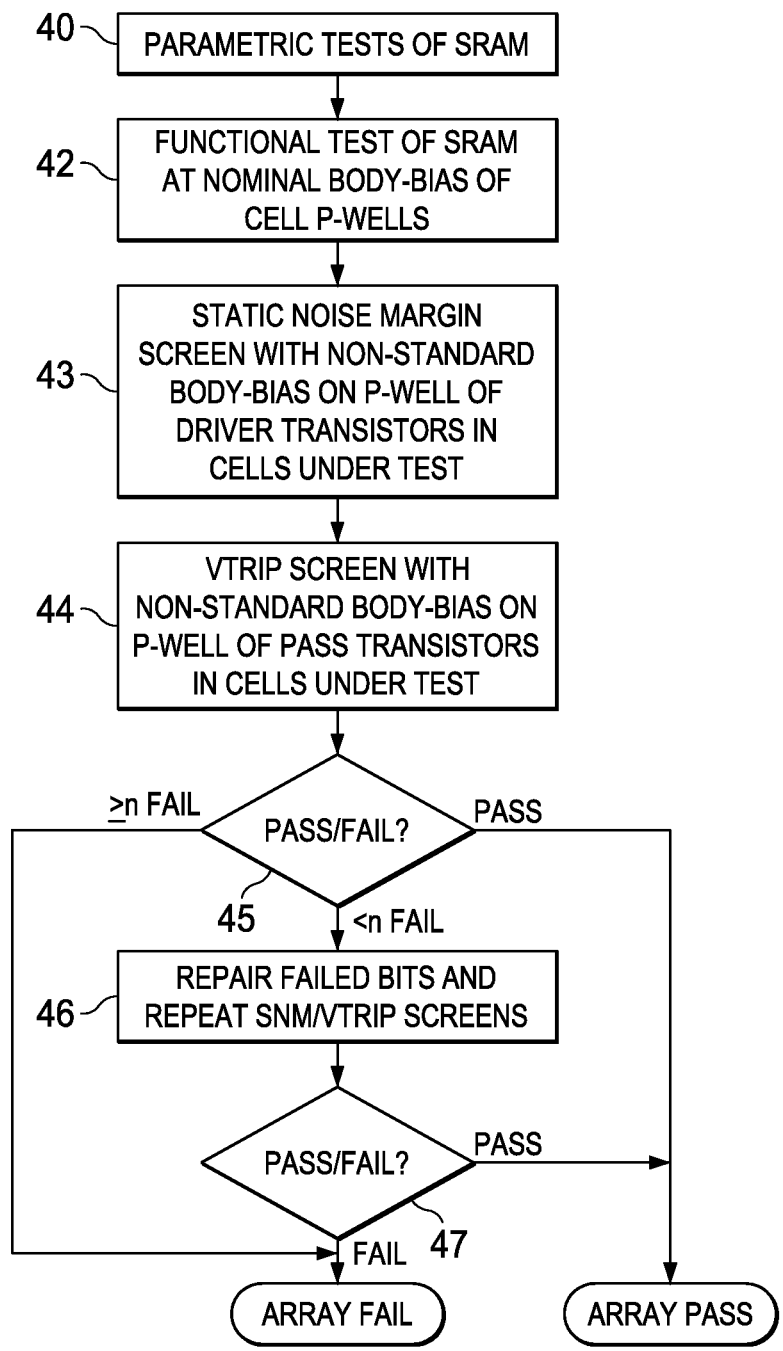
FIG. 6 is a flow diagram of a method of testing the memory of FIG. 3 according to embodiments of this invention.

Referring now to FIG. 6, a method of testing and screening SRAM cells 30 within RAM 18 of integrated circuit 10, or as a stand-alone memory integrated circuit, as the case may be, according to embodiments of this invention will now be described. It is contemplated that the test process of embodiments of this invention, which involve the application of various bias voltages to isolated p-wells 52 within memory array 20 as will be described below, is best suited for wafer-level testing (i.e., "multiprobe" functional testing), prior to packaging of integrated circuit 10, because of the relative ease of applying those separate bias voltages using conventional probes while integrated circuit 10 is still in wafer form. Once in packaged form, of course, the appropriate pads for applying such bias for test purposes are generally not available, due to the package cost involved in bonding those pads out to external package pins. Of course, if such provision is made (by bonding, or internal circuitry, or the like) to enable the application of these bias voltages in RAM 18 after packaging, the test process of FIG. 6 may of course then be performed after packaging.

It is contemplated that the method of FIG. 6 will typically be performed by way of automated test equipment, for example automated test equipment as used in functionally testing integrated circuits 10. The method of FIG. 6 will be described in connection with the testing of a population of memory cells, for example the testing of array 20 of RAM 18 of FIG. 3. It is contemplated that the particular test sequence may alternatively be applied fully to each memory cell in sequence (i.e., the entire test sequence performed for each cell $30_{jk}$ in turn). Further in the alternative, the test sequence may be applied to cells $30_{jk}$ in a row, column, or sub-array of array 20, or to some other population smaller than the entire array 20. As such, while the method described below in connection with FIG. 6 will refer to a population of cells 30 under test, it is to be understood that the number of cells 30 in that population can number from one to the entire array 20. It is contemplated that those skilled in the art having reference to this specification will be readily able to apply the test sequence of FIG. 6 to the appropriate number of memory cells 30 for specific memory architectures.

The manufacturing test flow shown in FIG. 6 according to embodiments of the invention begins with process 40 in which conventional parametric tests of both the DC and operating type (e.g., continuity, leakage, standby and active power dissipation, etc.) are performed upon RAM 18 under test. As described above and as will be described in further detail below, the screens according to embodiments of this invention are intended to identify those SRAM cells 30 that are vulnerable to failure over operating life under normal operating conditions. As such, functional tests are performed by the automated test equipment, in process 42, to evaluate the ability of RAM 18 to be written and read with both data states under such operating conditions and timing constraints required by specifications. According to these embodiments of the invention, functional test process 42 is performed under "normal" test vector conditions, in which normal n-channel transistor body node bias is applied to isolated p-wells 52 of SRAM cells $30_{jk}$. As known in the art, the term "test vector" refers to the set of conditions under which a memory is operated during a particular functional test; such conditions include, among others, the bias voltages applied to the memory array and periphery, the timing conditions of the read and write accesses to the addressed cells, and the ambient temperature at the memory during the test sequence. The normal test vector conditions under which functional test process 42 is performed in this embodiment of the invention includes the application of array and periphery power supply and bias voltages that are consistent with normal operating specifications and tolerances for RAM 18. For example, if the performance of RAM 18 is specified over a range of array power supply voltage ($V_{dda}$, for example) of 1.20 volts±5% relative to the array ground voltage ($V_{ssa}$, for example, adjusted by any guardbanding in the test process associated with the specified temperature range, noise margin, etc. According to this embodiment of the invention, these normal test vector conditions include a nominal body node bias being applied to the body node of n-channel transistors 34, 35 in each cell; this normal body node bias is typically at a ground voltage (i.e., the source node of driver transistors 34a, 34b). The timing and temperature conditions of the normal test vector conditions of process 42 are contemplated to correspond to nominal or other specification-based conditions for evaluating read/write functionality of RAM 18. Processes 40 and 42 thus remove, from the population of SRAM cells 30 or of integrated circuits 10 in the aggregate, those devices that do not meet the time-zero specifications desired of those functions. As such, screen processes 43, 44 according to embodiments of this invention are preferably applied only to devices that are known to be functionally and parametrically acceptable at this stage of manufacture.

According to this embodiment of the invention, static noise margin screen 43 is then performed by the automated test equipment on one or more SRAM cells 30 in RAM 18, to determine whether any of those cells 30 may be vulnerable to shifts in transistor characteristics over operating life, such shifts including PBTI threshold voltage shifts (to which modern high-k metal gate transistors are especially vulnerable, as described above), insofar as such shifts affect the static noise margin of the cell (i.e., cell stability).

Figure 7A:
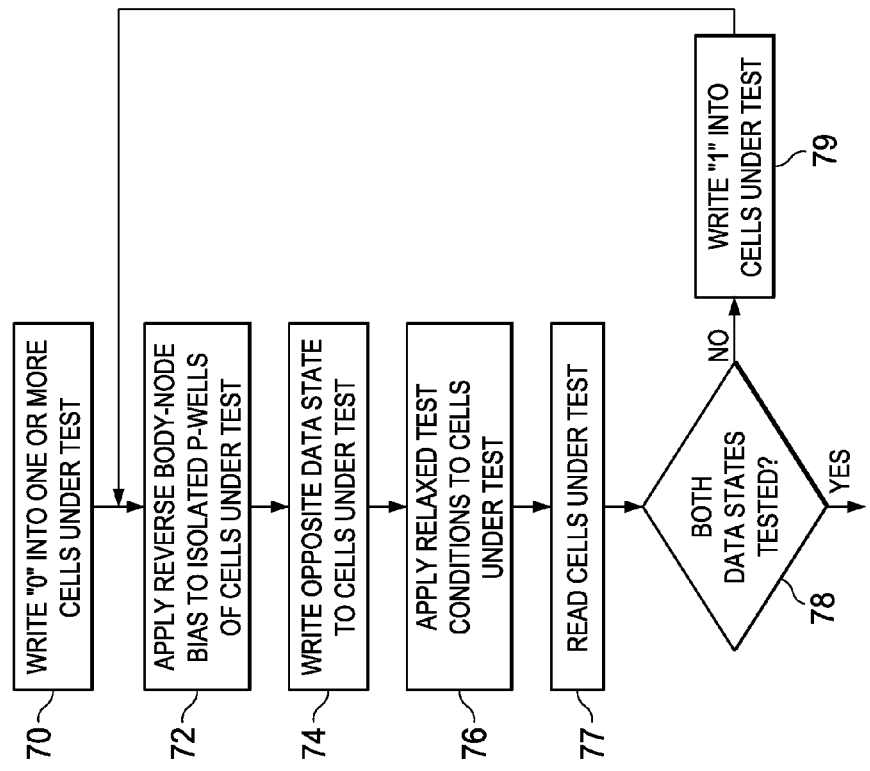
FIGS. 7a and 7b are flow diagrams of screens within the test method of FIG. 6, according to an embodiment of this invention.

FIG. 7a illustrates a method for performing screen 43 on one or more SRAM cells $30_{jk}$ constructed as described above relative to FIG. 4. In that construction, as described above, n-channel driver transistor 34a and pass transistor 35a are both formed within one isolated p-well 52a, and n-channel driver transistor 34b and pass transistor 35b are both formed within another isolated p-well 52b. Screen 43 in this embodiment of the invention will be described for the case in which isolated p-wells 52a, 52b are both biased to the same voltage, for efficiency of layout and conductor routing. In this case, while isolated p-wells 52a, 52b are not electrically isolated from one another (due to a metal or other conductor), both are isolated from the p-type region (e.g., substrate 51) in which peripheral n-channel transistors are formed, particularly those transistors that are within the read/write circuitry, precharge circuitry, and the like of RAM 18. As such, any varying body node bias applied to n-channel transistors 34, 35 within screens 43, 44 and other similar screen tests within the overall test flow will not affect the operation of those peripheral circuits in RAM 18. This ensures that any failure of screen will truly indicate a vulnerable cell, and will not be clouded by a possible loss of functionality in the peripheral circuitry involved in the test.

As shown in FIG. 7a, screen 43 in this example begins with the writing of a known data state (e.g., "0") into each of the SRAM cells $30_{jk}$ under test, in process 60. Process 60 is performed under nominal body node bias (as well as other nominal operating conditions); if desired, a read of those SRAM cells $30_{jk}$ may be performed to verify the written data state into these cells.

As described above, the primary effect of PBTI is a positive shift in the threshold voltage of n-channel transistors, particularly those at which a positive gate voltage (relative to the transistor channel region) has been present for some duration. This increased threshold voltage weakens the drive of the transistor, slowing its switching and also reducing its source/drain current in the "on" state. As such, a direct approach to evaluating this shift over time would be to apply a reverse bias to the body node of the one of driver transistors 34a, 34b that is in its "on" state. For the case of a "0" stored data state, in which storage node SNT of SRAM cell $30_{jk}$ of FIG. 4 is held at ground, this direct approach would apply a negative voltage to isolated p-well 52a, increasing the threshold voltage of driver transistor 34a and weakening its drive. However, because both driver transistor 34a and pass transistor 35a are formed within the same isolated p-well 52a in the embodiment of the invention shown in FIG. 4, the operating point of storage node SNT in the voltage divider presented by those two transistors (upon word line $WL_j$ being activated) would not change in response to that reverse body node bias. In other words, the effect of a PBTI shift at driver transistor 34a would not be apparent from that change in body node bias.

According to this embodiment of the invention, therefore, the effects of PBTI shift at driver transistor 34a are mimicked by the application of a positive voltage to isolated p-wells 52a, 52b, for each SRAM cell $30_{jk}$ currently under test. This voltage effectively applies a forward body node bias to all four n-channel transistors 34a, 34b, 35a, 35b in SRAM cell $30_{jk}$, strengthening the drive of each of those devices. For purposes of static noise margin screen 43, this forward body node bias causes the "off" driver transistor 34b (for the "0" state) to change state more easily in response to the voltage at bit line $BLT_k$, which corresponds to the same mechanism as a cell stability failure due to weakening of the "on" driver transistor 34a. As such, in process 62, the automated test equipment applies this positive voltage at isolated p-wells 52a, 52b of SRAM cells $30_{jk}$ under test, in process 62. An example of the forward body node bias applied in process 62, for SRAM cell $30_{jk}$ having a nominal power supply voltage $V_{dda}$ of 1.1 volts, is on the order of +0.1 volts to +0.6 volts.

In addition, the forward body node bias applied in process 62 mimics the effects of high temperature on the stability of SRAM cell $30_{jk}$. As known in the art and as mentioned above, cell stability has a worst case at high temperature. Accordingly, SNM screen 43 is able to effectively test for the worst case cell stability even though integrated circuit 10 is at room temperature or some other temperature below its specification limit.

Following the application of this forward body node bias to isolated p-wells 52a, 52b in process 62, the automated test equipment then "disturbs" SRAM cells $30_{jk}$ under test in process 64. The particular disturb applied in process 64 may consist of a read cycle in which bit lines $BLT_k$, $BLB_k$ are both precharged to a high voltage (e.g., at or near power supply voltage $V_{dda}$) followed by energizing word line $WL_j$ to turn on pass transistors 34a, 34b. As known in the art for a typical SRAM read cycle, the energizing of word line $WL_j$ initially couples the precharged voltage of bit lines $BLT_k$, $BLB_k$ to storage nodes SNT, SNB, respectively, according to the pass transistor/driver transistor voltage dividers. For a "0" state, the "on" condition of driver transistor 34a results in a lower nominal voltage at storage node SNT than at storage node SNB (driver transistor 34b being "off" for this data state), but typically storage node SNT increases in voltage at this stage of the read cycle, and storage node SNB decreases in voltage. In a "good" SRAM cell $30_{jk}$, this storage node differential voltage develops a differential voltage at bit lines $BLT_k$, $BLB_k$, which can be sensed by read/write circuitry 24. But if a higher than nominal threshold voltage is present at driver transistor 34a, indicative of its vulnerability to additional threshold voltage increases over operating life, the lowered threshold voltage at driver transistor 34b due to its forward body node bias can result in this vulnerable SRAM cell $30_{jk}$ to undesirably change state in this read operation. As such, the forward body node bias applied in process 62 can cause stored data upset in SRAM cells $30_{jk}$ that are vulnerable to PBTI over operating life.

Other types of disturb operations can be alternatively or additionally applied in process 64. These disturbs can involve "half-selection" of SRAM cell $30_{jk}$ under test. For example, a disturb can involve a write to a different SRAM cell $30_{jk}$ in the same row j but different column, or in the same column k but different row. Those skilled in the art having reference to this specification will readily identify those disturb conditions suitable for inclusion within process 64, particularly under the bias conditions applied in process 62.

In process 66, the automated test equipment applies relaxed test vector conditions to SRAM cells $30_{jk}$. These relaxed test vector conditions are intended to remove the effects of the forward body node bias in process 62, in order to evaluate the effects of disturb process 64. According to this embodiment of the invention, the relaxed test vector conditions applied in process 66 can include application of nominal body node bias to isolated p-wells 52a, 52b. Alternatively, particularly if the forward body node bias is to remain, the relaxed test vector conditions applied in process 66 may consist of relaxing the timing conditions at which RAM 18 will be operated, in order to counteract the effects of the forward body node bias. Other approaches to relaxing the test vector conditions may alternatively be applied. Under the relaxed test vector conditions, the automated test equipment then reads the contents of SRAM cells 30$_{jk}$ under test, in process 67, to determine whether the disturb of process 64 under the forward body node bias of isolated p-wells 52a, 52b applied in process 62 disrupted any of the stored "0" states written in process 60. The application of the relaxed test vector conditions in process 66 ensures that any failed reads discovered in process 66 are not due to the forward body node bias (SRAM cells 30$_{jk}$ having previously been tested in process 42 to ensure functionality under nominal conditions).

In decision 68, the automated test equipment determines whether both data states have been tested within static noise margin screen 43. If not (decision 38 is "no"), the automated test equipment writes "1" data states in to SRAM cells 30$_{jk}$ under test, in process 69. If desired, normal test vector conditions may be applied to RAM 18 prior to decision 68, if the relaxed conditions of process 66 are not considered as sufficient to reliably write the "1" data state. Processes 62, 64, 66, 67 are then repeated for this opposite data state. Upon completion of these processes for both data states (decision 68 is "yes"), static noise margin screen 43 is complete.

As shown for the example of FIG. 6, $V_{trip}$ screen process 44 is then performed following SNM screen 43. Of course, the order in which screens 43, 44 are performed can be altered from that shown in FIG. 6, it being understood that the specific order in which various tests are performed is largely unimportant for purposes of this invention. In $V_{trip}$ screen 44, one or more memory cells 30$_{jk}$ are tested to determine whether any exhibit a vulnerability to write failure as a result of transistor characteristic shift (such as threshold voltage increase in n-channel MOS transistors due to PBTI) over the expected operating life. Screen 44, according to this embodiment of the invention, identifies those SRAM cells 30$_{jk}$ that are susceptible to failure due to those effects by virtue of having a passing, but marginal, trip voltage $V_{trip}$ characteristic at time zero.

Figure 7B:
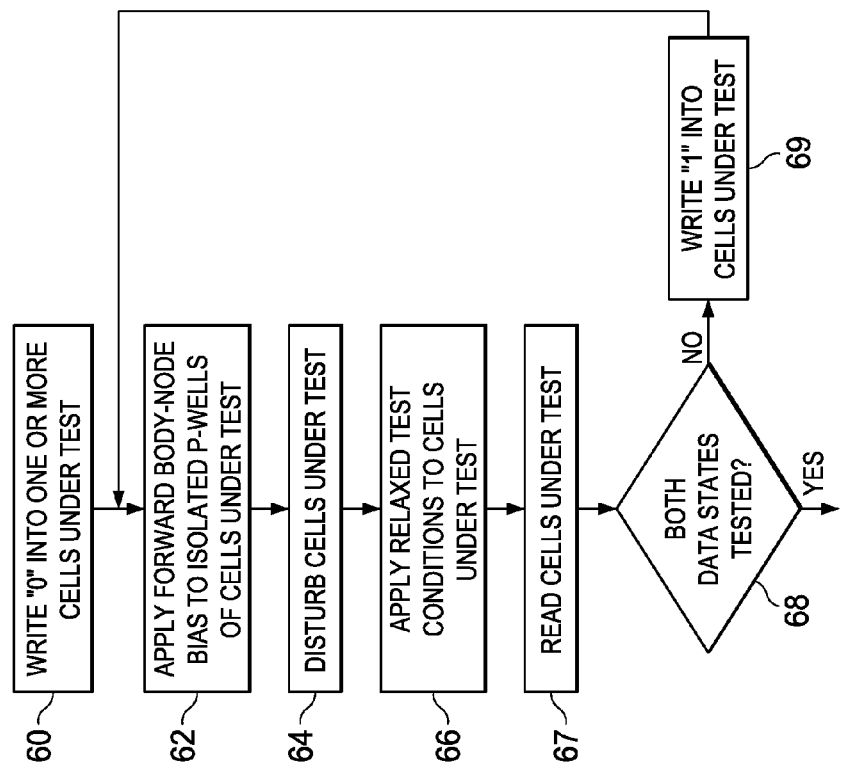

FIG. 7b illustrates an example of the operation of $V_{trip}$ screen 44 according to an embodiment of the invention, specifically for SRAM cell 30$_{jk}$ in which isolated p-wells 52a, 52b each include a driver transistor 34 and the corresponding pass transistor 35, and in which those p-wells 52a, 52b, while isolated from the body node of n-channel transistors in the peripheral circuits of RAM 18, are connected together and are thus driven with the same bias voltage. $V_{trip}$ screen process 44 begins with process 70, in which the automated test equipment writes "0" data states into all of the SRAM cells 30$_{jk}$ under test, under nominal bias conditions (including nominal body node bias applied to isolated p-wells 52a, 52b).

As described above, the positive shift in the threshold voltage of n-channel transistors due to PBTI can also cause write failure, more specifically a shift in the "trip" voltage $V_{trip}$ at which a cell changes state in response to a write operation. As mentioned above, in RAM 18 and as typical in many modern SRAM architectures, read/write circuitry 24 writes a data state into a cell by driving low (i.e., to ground) one of the complementary bit lines BLT$_k$, BLB$_k$ according to the desired data state; the other bit line remains precharged. This actively driven low level is communicated into the SRAM cell 30$_{jk}$ in column k that also resides in row j, for which its word line WL$_j$ is energized. If one of pass transistors 35a, 35b is weakened by a threshold voltage shift to reduce its coupling of the low level bit line BLT$_k$, BLB$_k$ to the corresponding storage node SNT, SNB, a shift in the trip voltage $V_{trip}$ results.

In addition, as discussed above, the worst case conditions for writing data into SRAM cells is at low temperature. Therefore, even if PBTI threshold voltage shifts are not of great concern (for example in the case of conventional gate dielectric transistors), screen 44 is able to mimic cold temperature effects that shift $V_{trip}$, by way of a wafer level test at room or elevated temperature.

For a data state of "0", pass transistor 35b is of interest, as it is connected between storage node SNB (which is at a high logic level in the "0" data state) and the low logic level driven at bit line BLB$_k$ to write the opposite data state. According to this embodiment of the invention, therefore, the weakening of pass transistor 35b as may occur over operating life is mimicked by applying a reverse body node bias to isolated p-wells 52a, 52b of SRAM cells 30$_{jk}$ under test. The resulting increase in threshold voltage for pass transistor 35b weakens the device in the same manner as PBTI or other positive threshold shifts of that transistor. The corresponding threshold voltage increase for the other transistors 34, 35, due to isolated p-wells 52a, 52b being connected together at the same voltage, does not detract from the effect of weakening the "1" side pass transistor 35b. More specifically, weakening of pass transistor 35a is not relevant because bit line BLT$_k$ is not pulled low in the write operation; similarly, weakening of driver transistor 34a is not relevant because it is already in "on" in storing the original "0" state. It has been observed that the weakening of driver transistor 34b, which will be switching from "off" to "on" as the "1" data state is written, is at most a second order effect in the writeability determination.

Accordingly, in process 72, the automated test equipment applies a negative voltage to isolated p-wells 52a, 52b of SRAM cells 30$_{jk}$ under test, which results in a reverse body node bias for n-channel transistors 34, 35 in those cells. An example of the reverse body node bias applied in process 72, for SRAM cell 30$_{jk}$ having a nominal power supply voltage $V_{dda}$ of 1.1 volts, is on the order of −0.1 volts to −3.0 volts. Following process 72, and thus under the reverse body node bias condition, the automated test equipment writes the opposite data state ("1" in this instance) to SRAM cells 30$_{jk}$ under test, in process 74. As discussed above, the ability of this write operation to change the state of SRAM cells 30$_{jk}$ under test is reduced by the reverse body node bias of pass transistor 35b (for this data state).

The result of the write of process 74 is then evaluated by the automated test equipment, by applying relaxed test vector conditions to SRAM cells 30$_{jk}$ under test, or to RAM 18 generally, in process 76, followed by reading the state of SRAM cells 30$_{jk}$ under test in process 77 to determine whether the write of the opposite data state in process 74 was effective for those cells. Again, the relaxed test vector conditions (which, as before, may include the application of nominal body node bias, relaxed timing, or other test conditions) at which read process 77 is performed ensure that any failure can be accurately considered as a write failure under the reverse body node bias condition, rather than a read failure of RAM 18 generally.

In decision 78, the automated test equipment determines whether both data states have been tested within $V_{trip}$ screen 44. If not (decision 68 is "no"), the automated test equipment writes "1" data states in to SRAM cells 30$_{jk}$ under test, in process 79 under the relaxed test vector conditions applied in process 76 or under other such appropriate test vector conditions to reliably write the "1" data state. SRAM cells 30$_{jk}$ under test are then again subjected to processes 72, 74, 76, 77 for the opposite ("1") data state. Upon completion of these processes for both data states (decision 78 is "yes"), $V_{trip}$ screen 44 is complete.

If RAM 18 includes redundant rows or columns (or both) of SRAM cells $30_{jk}$ that are available to replace main array cells that fail either of screens 43, 44, redundant replacement of any identified failed cells can be performed in the manner shown in FIG. 6. The automated test equipment determines, in decision 45, whether any SRAM cells $30_{jk}$ failed either of screens 43, 44; if not (decision 45 is "pass"), memory array 20 is considered as having passed and is ready for further manufacture. If more SRAM cells $30_{jk}$ failed either or both of screens 43, 44 than can be replaced by the available redundant cells (decision 45 is "≥n fail"), memory array 20 is considered to have failed, and is disposed of or otherwise reworked as appropriate. If one or more, but fewer than the limit of, SRAM cells $30_{jk}$ failed screens 43, 44, conventional redundant replacement and mapping of redundant cells is performed in process 45, and those newly enabled SRAM cells $30_{jk}$ are themselves screened by screens 43, 44 to ensure their adequate stability over the expected operating life. Assuming that these repeated screens 43, 44 do not identify additional vulnerable bits (decision 47 is "pass"), memory array 20 is then ready for additional manufacture.

Following the test method shown in FIG. 6, and such other test and wafer-level processing as appropriate, integrated circuit 10 will proceed to the desired packaging and additional test stages of the manufacturing process. In the packaging of integrated circuit 10, it is contemplated that the pads available at the wafer level for the application of body node bias to isolated p-wells 52 in memory array 20 will be bonded out or otherwise hard-wired to the appropriate voltage terminal (e.g., ground $V_{ssa}$) so that operation of RAM 18 in its system application will be carried out with nominal body node bias applied to each SRAM cell $30_{jk}$ in the device. Alternatively, as described in the above-incorporated copending U.S. application Ser. No. 13/196,010, alternative bias to isolated p-wells 52 may be used in that normal operation of RAM 18.

Figure 8:
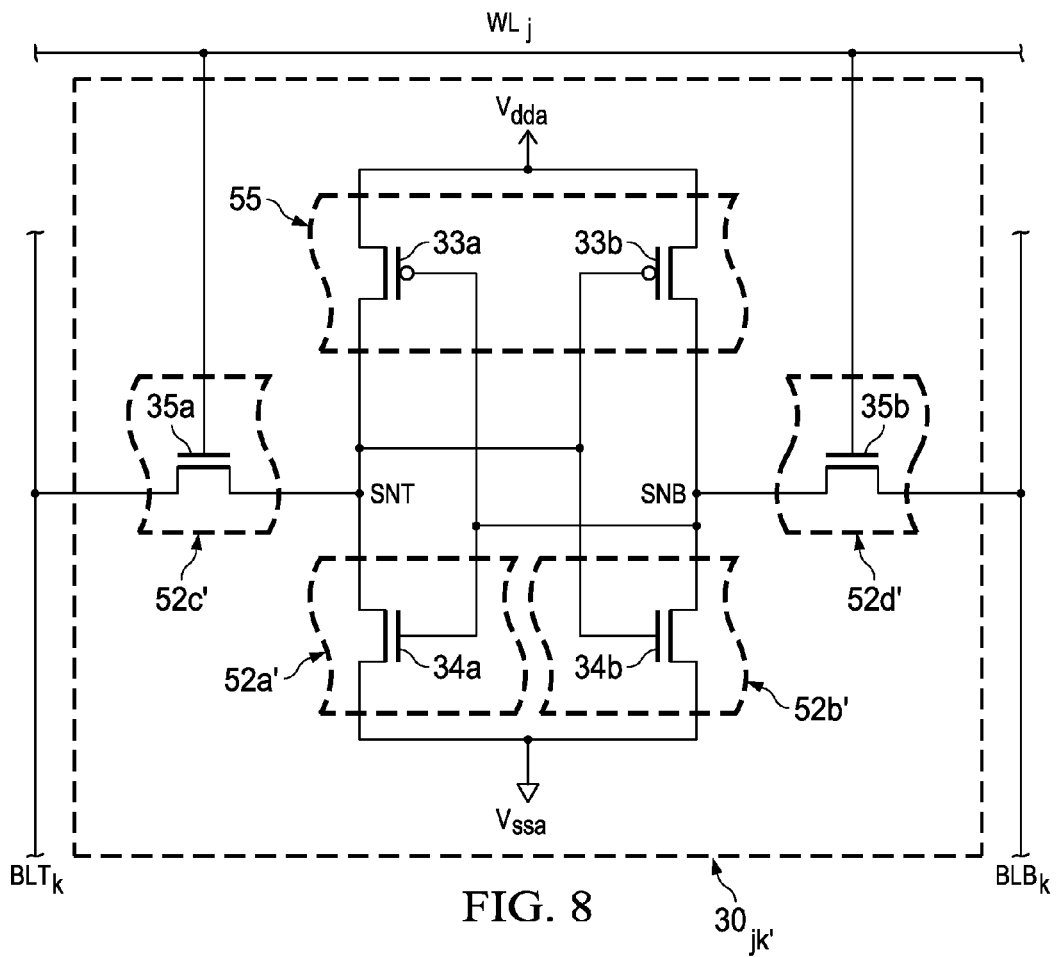
FIG. 8 is an electrical diagram, in schematic form, of an SRAM cell suitable for testing according to another embodiment of this invention.

The screens for static noise margin and $V_{trip}$ described above are presented for the case of isolated p-wells 52a, 52b that are connected together so that all n-channel transistors 34, 35 in a given SRAM cell $30_{jk}$ receive the same body node bias. This arrangement is desirable from the standpoint of layout efficiency and chip area. However, additional accuracy can be attained if these n-channel transistors 34, 35 can receive independent body node bias from one another, which would more closely mimic the effects of PBTI shifts. FIG. 8 illustrates, by way of an electrical schematic, SRAM cell $30_{jk}'$ in which each of n-channel transistors 34, 35 is constructed within a p-well 52 that is isolated from the others. More specifically, driver transistor 34a is formed within isolated p-well 52a', driver transistor 34b is formed within isolated p-well 52b', pass transistor 35a is formed within isolated p-well 52c', and pass transistor 35b is formed within isolated p-well 52d'. In this embodiment of the invention, each of these isolated p-wells 52a' through 52d' can be separately and independently biased from one another.

It is contemplated that those skilled in the art having reference to this specification will be readily able to implement and optimize these isolated p-wells 52a' through 52d' within each SRAM cell $30_{jk}'$ as most appropriate for a given layout, without undue experimentation. It is contemplated, however, that this construction will necessarily increase the chip area required for each instance of SRAM cell $30_{jk}'$. Some efficiency may be recovered by combining isolated p-wells 52' of adjacent cells, so long as these p-wells 52a' through 52d' remain isolated from one another within each SRAM cell $30_{jk}'$.

FIG. 9a illustrates a test method for performing static noise margin screen 43' within the context of the overall test flow of FIG. 6, but in a way that takes advantage of the independent isolated p-wells 52a' through 52d' in SRAM cell $30_{jk}'$ of FIG. 8 when under test. As before, SNM screen 43' begins with process 80, in which a known data state (e.g., "0" in this case) is written into each SRAM cell $30_{jk}'$ under test, under nominal body node bias and nominal power supply and timing conditions.

In process 82 according to this embodiment of the invention, a reverse body node bias is applied to the isolate p-well 52' for the driver transistor 34 of SRAM cell $30_{jk}'$ under test that is currently in the "on" state, and thus which has its drain node at the storage node at a "0" level. For SRAM cell $30_{jk}'$ of FIG. 8 storing a "0" data state (storage node SNT at a low logic level), the automated test equipment applies a negative voltage to isolated p-well 52a' sufficient to apply a reverse body node bias to driver transistor 34a. For example, it is contemplated that the reverse body node bias applied in process 72 may be on the order of −0.1 volts to −3.0 volts, for SRAM cell $30_{jk}'$ having a nominal power supply voltage $V_{dda}$ of 1.1 volts. This reverse body node bias will increase the threshold voltage of driver transistor 34a, weakening its drive and increasing the voltage divided between transistors 34a, 35a, making it more difficult for driver transistor 34b to maintain its "off" state in the event of a disturb. As such, this increased threshold voltage of driver transistor 34a precisely mimics the effect of PBTI threshold shift over operating life, as well as the effect of high temperature conditions on cell stability.

Isolated p-wells 52b', 52c', 52d' may remain at their nominal body node bias (e.g., ground level $V_{ssa}$). Alternatively, considering that these isolated p-wells 52b', 52c', 52d' may be independently biased, optional process 83 may be performed by the automated test equipment to apply a positive voltage to those isolated p-wells 52b', 52c', 52d', resulting in a forward body node bias for their respective n-channel transistors 34b, 35a, 35b, which reduces their threshold voltages and strengthens their drive characteristics. This forward bias process 83 will exacerbate the effects of the increased threshold voltage at driver transistor 34a following process 82, further disrupting cell stability.

Following process 82, and process 83 if performed, the automated test equipment disturbs and tests SRAM cells $30_{jk}'$ in the manner described above for SNM screen 43 of FIG. 7a. In summary, SRAM cells $30_{jk}'$ under test are disturbed (e.g., by way of a read cycle) in process 84 under the bias condition established in processes 82, 83. Relaxed test vector conditions (e.g., nominal body node bias, relaxed timing conditions, etc.) are applied to SRAM cells $30_{jk}'$ under test in process 86, following which the contents of SRAM cells $30_{jk}'$ under test are read in process 87, with the expected (i.e., passing) data state being the "0" state originally written in process 80. Conversely, if the disturb of process 84 caused one or more of SRAM cells $30_{jk}'$ under test to change state, read process 87 will return a "1" data state for that cell or cells.

Decision 88 determines whether both data states have been tested within SNM screen 43'; if not (decision 88 is "no"), the automated test equipment writes the opposite ("1") data state into each of SRAM cells $30_{jk}'$ under test in process 89, under nominal body node bias or other relaxed test vector conditions, and processes 82, 83, 84, 86, 87 are repeated for this opposite data state. Of course, for the case in which a SRAM cell $30_{jk}'$ under test is storing a "1" state, isolated p-well 52b' will receive the reverse body node bias to increase the threshold voltage of driver transistor 34b; the other re-channel transistors 34a, 35a, 35b will have either a nominal or forward body node bias, as desired, for the SNM screen for this data state. Upon both data states having been tested (decision 88 is "yes"), RAM 18 can receive $V_{trip}$ screen 44' as will now be described relative to FIG. 9b.

$V_{trip}$ screen 44' begins, as before, with the writing of a known data state (e.g., "0") into each of SRAM cells $30_{jk}$' under test, in process 90. Writing process 90 is performed under nominal body node bias, as well as nominal power supply voltages and timing conditions, to ensure a successful initial setting of this data state.

In process 92, a negative voltage is applied to the isolated p-well 52c', 52d' in which the pass transistor 35a, 35b that is coupled to the storage node SNT, SNB, respectively, that is at a "1" level. For the case in which SRAM cell $30_{jk}$' is storing a "0" level, the automated test equipment will apply this negative voltage to isolated p-well 52d' containing pass transistor 35b. The threshold voltage of pass transistor 35b will increase, as a result, weakening its drive and thus reducing its ability to couple a low logic level from bit line $BLB_k$ to storage node SNB in a write operation. This reverse body node bias thus directly mimics the effect of PBTI threshold shift at pass transistor 35b over its operating life, especially in the case of high-k metal gate transistors. In addition, this reverse body node bias also corresponds to the effects of low temperature operation of SRAM cell $30_{jk}$' under test, thus enabling the use of room temperature or other elevated temperature screens for the worst case $V_{trip}$ vulnerability that occurs at low temperature.

Isolated p-wells 52a', 52b', 52c' can remain at their nominal body node bias, if desired. Optionally, the automated test equipment can perform process 93 to apply a forward body node bias to p-well 52a' in order to lower the threshold voltage of transistor 34a, and to apply a reverse body node bias to p-wells 52b', 52c' to increase the threshold voltage of transistors 34b, 35a, respectively. This bias will exacerbate the $V_{trip}$ sensitivity caused by the reverse body node bias of pass transistor 35b, and is useful to screen this condition for additional margin.

According to this embodiment of the invention, the automated test equipment performs a write of the opposite data state ("1") to SRAM cells $30_{jk}$' in process 94, under the bias conditions applied in processes 92, 93. To determine whether the write of process 94 succeeded, relaxed test vector conditions (e.g., nominal body node bias, relaxed timing conditions, etc.) are applied to SRAM cells $30_{jk}$' under test in process 96, followed by the read of those cells in process 97. The expected (i.e., passing) data state read in process 94 is, of course, the "1" data state written in process 94. Conversely, if one or more of SRAM cells $30_{jk}$' under test has a $V_{trip}$ susceptibility, read process 97 will return the originally written "0" data state for that cell or cells.

Decision 98 determines whether both data states have been tested within $V_{trip}$ screen 44'. If not (decision 98 is "no"), the automated test equipment writes the opposite ("1") data state into each of SRAM cells $30_{jk}$' under test in process 99, under nominal body node bias or other relaxed test vector conditions. Processes 92, 93, 94, 96, 97 are then repeated for this data state. In that repeated instance of process 92, isolated p-well 52c' will receive reverse body node bias, increasing the threshold voltage of pass transistor 35a. Upon both data states having been tested (decision 98 is "yes"), disposition of RAM 18 and integrated circuit 10 as described above in connection with FIG. 6 can then proceed.

As evident from the above, embodiments of this invention have been described in connection with the screening of SRAM cells. It is contemplated, however, that other types of memory cells, such as memory cells in ROM 19 of integrated circuit 10, of varying construction, may also be susceptible to the threshold voltage and other shifts in transistor characteristics that can be screened at time-zero according to embodiments of this invention. In addition, it is contemplated that logic circuitry can also benefit from this time-zero screening using varying body node bias, especially logic circuitry that includes flip-flops and latches constructed from cross-coupled CMOS inverters similar to SRAM cells.

Embodiments of this invention provide numerous important benefits and advantages over conventional memory test approaches. As described above, the ability to apply body node bias voltages to transistors within memory cells enables the more direct screening of vulnerable cells than is conventionally available by way of "proxy" bias voltages that must be applied via peripheral memory circuitry. Such peripheral circuitry typically includes level shifters and other circuits that limit the extent to which the proxy voltages can be modulated for such screening; in addition, other effects such as punchthrough of transistor isolation can occur under some proxies. As such, more direct and more robust screening for later life threshold voltage shifts, including in n-channel transistors due to PBTI, as well as for variations of operating temperature, is thus provided by embodiments of this invention.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of testing cell stability in a memory of a metal-oxide-semiconductor (MOS) integrated circuit, the memory including peripheral circuitry, and including an array of memory cells that are each comprised of first and second cross-coupled inverters and first and second pass transistors, each column of memory cells associated with a pair of bit lines coupled to the first and second pass transistors of the memory cells in the column, and each row of memory cells associated with a word line coupled to gates of the pass transistors of the memory cells in the row, the method comprising:

writing a first data state to a selected memory cell under normal test vector conditions applied to the cross-coupled inverters of the memory cell;

applying a forward body node bias to at least one of the n-channel transistors of the selected memory cell;

applying a reverse body node bias to another one of the n-channel transistors of the selected memory cell, each of the n-channel transistors constructed in a p-type well region that is electrically isolated from p-type semiconductor regions in the peripheral circuitry within which n-channel transistors are formed;

then performing a disturb operation to the selected memory cell;

then applying relaxed test vector conditions; and under the relaxed test vector conditions, reading the state of the selected memory cell for comparison with the first data state.

2. The method of claim 1, wherein the step of applying relaxed test vector conditions comprises:
applying a nominal body node bias to the at least one of the n-channel transistors to which the forward or reverse body node bias was applied.

3. The method of claim 1, wherein the step of applying relaxed test vector conditions comprises:
performing the reading step under relaxed memory access timing conditions.

4. The method of claim 1, wherein the first inverter in the selected memory cell comprises:
a first load; and
a first n-channel driver transistor having a gate, and having a source/drain path connected to the first load at a first storage node;
wherein the second inverter in the selected memory cell comprises:
a second load; and
a second n-channel driver transistor having a gate connected to the first storage node, and having a source/drain path connected to the second load at a second storage node, the second storage node being connected to the gate of the first n-channel driver transistor;
wherein the first data state corresponds to the first storage node at a low voltage and the second storage node at a high voltage; and wherein the step of applying a forward body node bias comprises:
applying a forward body node bias to the second n-channel driver transistor.

5. The method of claim 4, wherein the first pass transistor and the first driver transistor are formed within a first p-type well region;
wherein the second pass transistor and the second driver transistor are formed within a second p-type well region isolated from the first p-type well region;
and wherein the step of applying a forward body node bias comprises applying a positive voltage to the second p-type well region.

6. The method of claim 5, wherein the step of applying a forward body node bias further comprises applying the positive voltage to the first p-type well region.

7. The method of claim 1, wherein the first inverter in the selected memory cell comprises:
a first load; and
a first n-channel driver transistor having a gate, and having a source/drain path connected to the first load at a first storage node;
wherein the second inverter in the selected memory cell comprises:
a second load; and
a second n-channel driver transistor having a gate connected to the first storage node, and having a source/drain path connected to the second load at a second storage node, the second storage node being connected to the gate of the first n-channel driver transistor;
wherein the first data state corresponds to the first storage node at a low voltage and the second storage node at a high voltage; and wherein the step of applying a reverse body node bias comprises:
applying a reverse body node bias to the first n-channel driver transistor.

8. The method of claim 7, wherein the first driver transistor is formed within a p-type well region that is isolated from the p-type well region within which the second driver transistor is formed; and wherein the step of applying a reverse body node bias and the step of applying a forward body node bias comprises:
applying a negative voltage to the p-type well region within which the first n-channel driver transistor is formed; and
applying a positive voltage to the p-type well region within which the second n-channel driver transistor is formed.

9. The method of claim 7, wherein the first driver transistor is formed within a p-type well region that is isolated from the p-type well region within which the second driver transistor is formed;
wherein the first and second pass transistors are each n-channel transistors;
wherein the first and second pass transistors are each formed within p-type well regions that are isolated from the p-type well regions within which the first and second driver transistors, respectively, are formed;
and wherein the step of applying a forward body node bias further comprises:
applying a positive voltage to the p-type well regions in which the first pass transistor is formed.

10. The method of claim 7, wherein the first and second pass transistors are each n-channel transistors;
wherein the first n-channel driver transistor and first pass transistor are formed within the same p-type well region as one another;
and wherein the step of applying the reverse body node bias to the first n-channel transistor also applies the reverse body node bias to the first pass transistor.

11. The method of claim 1, wherein each of the first and second driver transistors comprise:
a gate dielectric comprising a high-k dielectric material; and
a gate electrode comprised of a metal or a metal compound.

12. The method of claim 1, wherein the normal test vector conditions include a nominal body node bias being applied to n-channel driver transistors in the cross-coupled inverters of the memory cell.

13. The method of claim 1, further comprising:
writing a second data state to the selected memory cell under normal test vector conditions applied to the cross-coupled inverters of the memory cell;
applying a forward body node bias to at least one of the n-channel transistors of the selected memory cell;
applying a reverse body node bias to at least one of the n-channel transistors of the selected memory cell, each of the n-channel transistors constructed in a p-type well region that is electrically isolated from p-type semiconductor regions in the peripheral circuitry within which n-channel transistors are formed;
then performing a disturb operation to the selected memory cell;
then applying relaxed test vector conditions; and
under the relaxed test vector conditions, reading the state of the selected memory cell for comparison with the second data state.

14. A method of testing writeability in a memory of a metal-oxide-semiconductor (MOS) integrated circuit, the memory including peripheral circuitry, and including an array of memory cells that are each comprised of first and second cross-coupled inverters and first and second n-channel pass transistors, each column of memory cells associated with a pair of bit lines coupled to the first and second pass transistors of the memory cells in the column, and each row of memory cells associated with a word line coupled to gates of the pass transistors of the memory cells in the row, the method comprising:

writing a first data state to a selected memory cell under normal test vector conditions;

applying a modulated body node bias to at least one of the n-channel pass transistors of the selected memory cell, each of the n-channel pass transistors constructed in a p-type well region that is electrically isolated from p-type semiconductor regions in the peripheral circuitry within which n-channel transistors are formed;

then performing a write operation to the selected memory cell to write a second data state into the selected memory cell;

then applying relaxed test vector conditions; and under the relaxed test vector conditions, reading the state of the selected memory cell for comparison with the second data state.

15. The method of claim 14, wherein the step of applying relaxed test vector conditions comprises:

applying a nominal body node bias to the at least one of the n-channel transistors to which the modulated body node bias was applied.

16. The method of claim 14, wherein the step of applying relaxed test vector conditions comprises:

performing the reading step under relaxed memory access timing conditions.

17. The method of claim 14, wherein the first inverter in the selected memory cell comprises:

a first load; and
a first n-channel driver transistor having a gate, and having a source/drain path connected to the first load at a first storage node;

wherein the second inverter in the selected memory cell comprises:

a second load; and
a second n-channel driver transistor having a gate connected to the first storage node, and having a source/drain path connected to the second load at a second storage node, the second storage node being connected to the gate of the first n-channel driver transistor;

wherein the first data state corresponds to the first storage node at a low voltage and the second storage node at a high voltage; and wherein the step of applying a modulated body node bias comprises:

applying a reverse body node bias to the second n-channel pass transistor.

18. The method of claim 17, wherein the first pass transistor and the first driver transistor are formed within a first p-type well region;

wherein the second pass transistor and the second driver transistor are formed within a second p-type well region isolated from the first p-type well region;

and wherein the step of applying a reverse body node bias comprises applying a negative voltage to the second p-type well region.

19. The method of claim 18, wherein the step of applying a modulated body node bias further comprises applying the negative voltage to the first p-type well region.

20. The method of claim 14, wherein the first n-channel driver transistor is formed within a p-type well region that is isolated from the p-type well region within which the second pass transistor is formed; and wherein the step of applying a modulated body node bias further comprises:

applying a forward body node bias to the first n-channel driver transistor.

21. The method of claim 14, wherein each of the first and second driver transistors and each of the first and second pass transistors comprise:

a gate dielectric comprising a high-k dielectric material; and
a gate electrode comprised of a metal or a metal compound.

22. The method of claim 14, wherein the normal test vector conditions comprise a nominal body node bias being applied to n-channel transistors in the selected memory cell.

23. The method of claim 14, further comprising:

writing a second data state to the selected memory cell under normal test vector conditions;

applying a modulated body node bias to at least one of the n-channel pass transistors of the selected memory cell, each of the n-channel pass transistors constructed in a p-type well region that is electrically isolated from p-type semiconductor regions in the peripheral circuitry within which n-channel transistors are formed;

then performing a write operation to the selected memory cell to write a second data state into the selected memory cell;

then applying relaxed test vector conditions; and reading the state of the selected memory cell for comparison with the second data state.

24. A method of testing a metal-oxide-semiconductor (MOS) integrated circuit comprising at least one element comprised of p-channel MOS transistors and n-channel MOS transistors arranged in a cross-coupled fashion, the n-channel MOS transistors of the element formed within one or more p-type well regions of the integrated circuit that are electrically isolated from a p-type region in which other n-channel MOS transistors in the integrated circuit away from the element are formed, the method comprising:

setting a first retained state of the element;

applying a reverse body node bias to at least one of the n-channel MOS transistors in order to increase its threshold voltage;

applying a forward body node bias to another one of the n-channel MOS transistors in order to decrease its threshold voltage;

then performing an operation to the element selected from the group consisting of sensing the state of the element and changing the state of the element; and then sensing the state of the element for comparison with the first retained state.

25. The method of claim 24, wherein the step of setting the first retained state is performed under bias conditions in which a nominal body node bias is applied to the n-channel MOS transistors of the element.

26. The method of claim 24, further comprising:

after the step of performing an operation and prior to the sensing step, applying a nominal body node bias to the at least one of the n-channel MOS transistors to which the modulated body node bias was applied.

27. The method of claim 24, wherein the at least one of the n-channel MOS transistors in the element is formed in a p-type well region comprised of a portion of a p-type substrate surrounded on its sides by one or more n-type well regions, and overlying an n-type deep well region;

and wherein the p-type region in which other n-channel MOS transistors in the integrated circuit away from the element are formed comprises a portion of the p-type substrate.

\* \* \* \* \*